United States Patent [19]

Hanaguri et al.

[11] Patent Number: 5,730,847
[45] Date of Patent: Mar. 24, 1998

[54] ARC ION PLATING DEVICE AND ARC ION PLATING SYSTEM

[75] Inventors: Koji Hanaguri; Kunihiko Tsuji; Homare Nomura; Hiroshi Tamagaki; Hiroshi Kawaguchi; Katsuhiko Shimojima; Hirofumi Fujii; Toshiya Kido; Takeshi Suzuki; Yoichi Inoue, all of Takasago, Japan

[73] Assignee: Kabushiki Kaisha Kobeseikosho, Kobe, Japan

[21] Appl. No.: 325,438
[22] PCT Filed: Mar. 15, 1994
[86] PCT No.: PCT/JP94/00410
  § 371 Date: Dec. 23, 1994
  § 102(e) Date: Dec. 23, 1994
[87] PCT Pub. No.: WO94/21839
  PCT Pub. Date: Sep. 29, 1994

[30] Foreign Application Priority Data

Mar. 15, 1993 [JP] Japan .................... 5-081406

[51] Int. Cl.⁶ .................... C23C 14/32; C23C 14/24
[52] U.S. Cl. .................... 204/298.41; 204/298.05; 204/192.38; 204/298.11; 204/298.14; 204/298.15; 204/298.23; 204/298.25; 204/298.27; 204/298.28; 204/298.29; 118/723 VE; 118/719
[58] Field of Search .................... 204/298.41, 192.38, 204/298.11, 298.14, 298.15, 298.23, 298.25, 298.26, 298.27, 298.28, 298.05; 118/723 VE, 719

[56] References Cited

U.S. PATENT DOCUMENTS

| | | | |
|---|---|---|---|
| 4,151,059 | 4/1979 | Kuehnle | 204/192.26 |
| 4,252,626 | 2/1981 | Wright | 204/298.28 |
| 4,886,592 | 12/1989 | Anderle et al. | 118/719 |
| 4,919,968 | 4/1990 | Buhl et al. | 204/192.38 |
| 5,037,522 | 8/1991 | Vergason | 204/298.41 |
| 5,135,635 | 8/1992 | Ikeda | 118/719 |
| 5,269,896 | 12/1993 | Munemasa et al. | |
| 5,269,898 | 12/1993 | Welty | 204/298.41 |
| 5,275,709 | 1/1994 | Anderle et al. | 204/298.25 |
| 5,277,714 | 1/1994 | Tamagaki | 204/298.41 |
| 5,380,420 | 1/1995 | Tsuji | 204/298.41 |

FOREIGN PATENT DOCUMENTS

| | | |
|---|---|---|
| 52-14690 | 4/1977 | Japan . |
| 58-3033 | 1/1983 | Japan . |
| 63-26346 | 2/1988 | Japan . |
| 1 136966 | 5/1989 | Japan . |
| 1 205066 | 8/1989 | Japan . |
| 1 208449 | 8/1989 | Japan . |
| 1-136966 | 8/1989 | Japan . |
| 1 263265 | 10/1989 | Japan . |
| 1 161257 | 11/1989 | Japan . |
| 3 36263 | 2/1991 | Japan . |
| 3 11226 | 3/1991 | Japan . |
| 1-208449 | 8/1991 | Japan . |
| 4-224671 | 8/1992 | Japan . |
| 4 110747 | 9/1992 | Japan . |
| 4 276062 | 10/1992 | Japan . |
| 2 160 898 | 1/1986 | United Kingdom . |

*Primary Examiner*—R. Bruce Breneman
*Assistant Examiner*—Rodney G. McDonald
*Attorney, Agent, or Firm*—Oblon, Spivak, McClelland, Maier & Neustadt, P.C.

[57] ABSTRACT

The present invention relates to an arc ion plating device utilizing a vacuum arc discharge to be utilized for the surface process of works and to an arc ion plating system provided with the above-mentioned device, and the present invention offers the device and the system which are able to realize extremely high productivity by an efficient handling of works. The device according to the present invention comprises a rod-shaped evaporation source and works to be coated with a film being disposed so as to surround the rod-shaped evaporation source. The device is so constituted that the works can be moved relative to the rod-shaped evaporation source in the axial direction of the rod-shaped evaporation source.

22 Claims, 16 Drawing Sheets

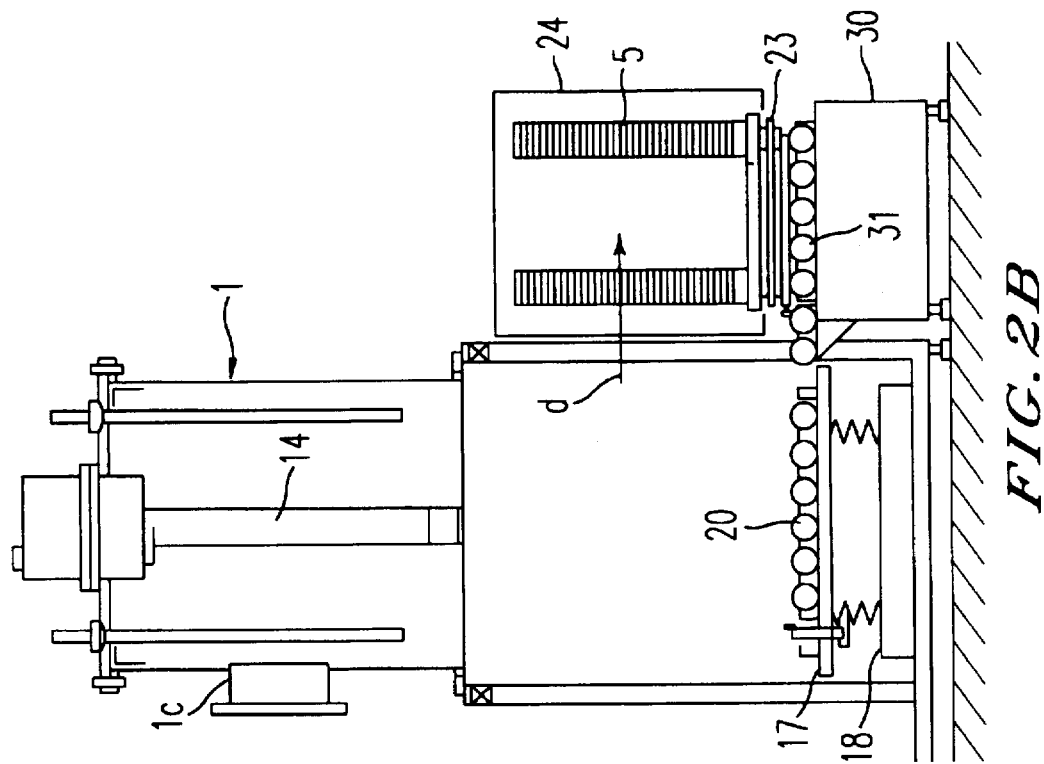
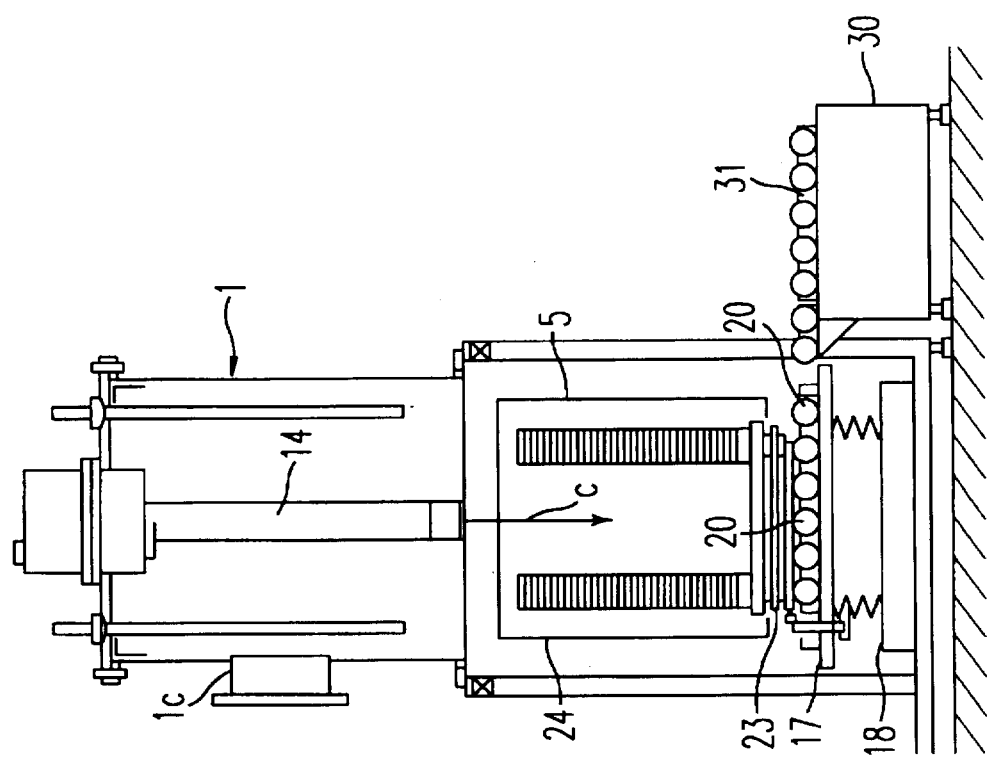

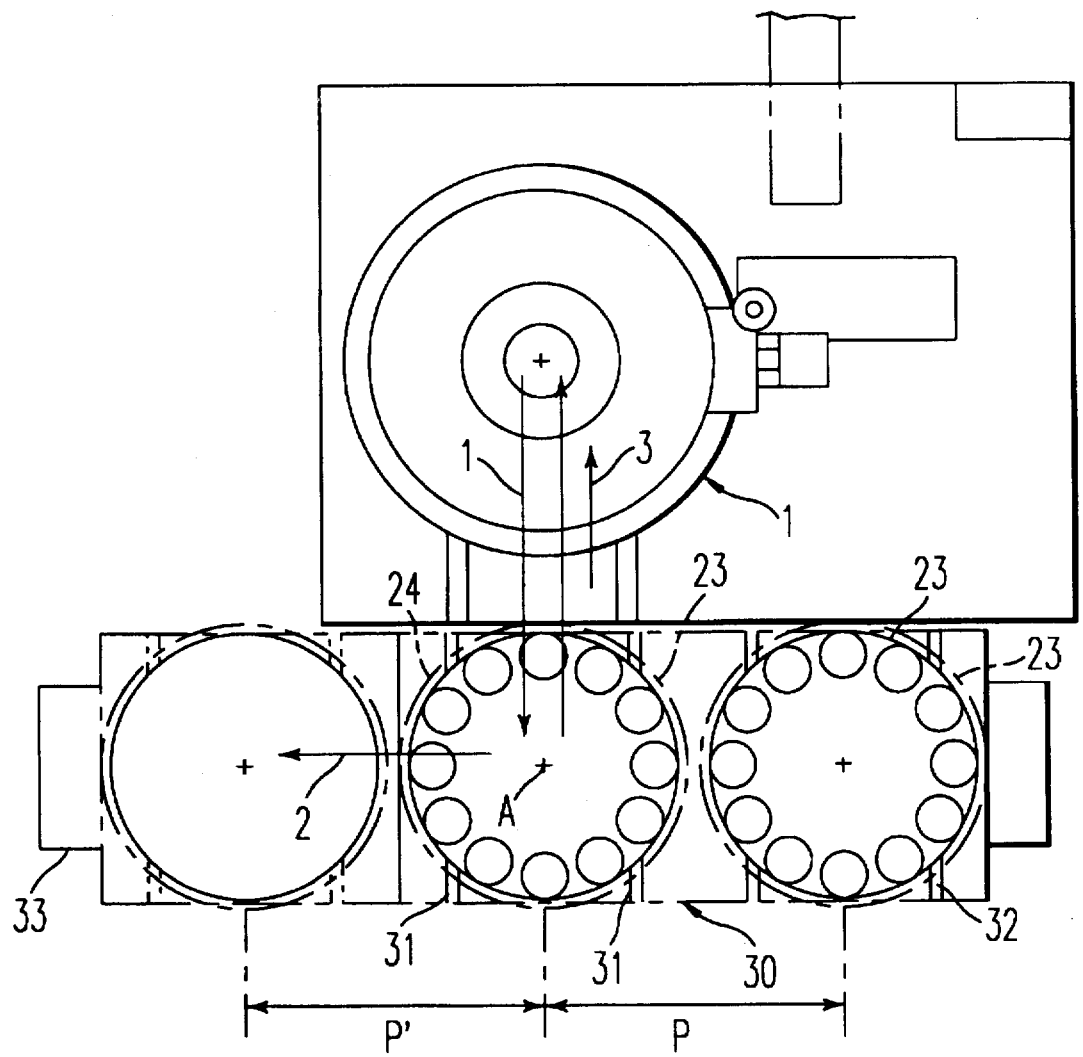

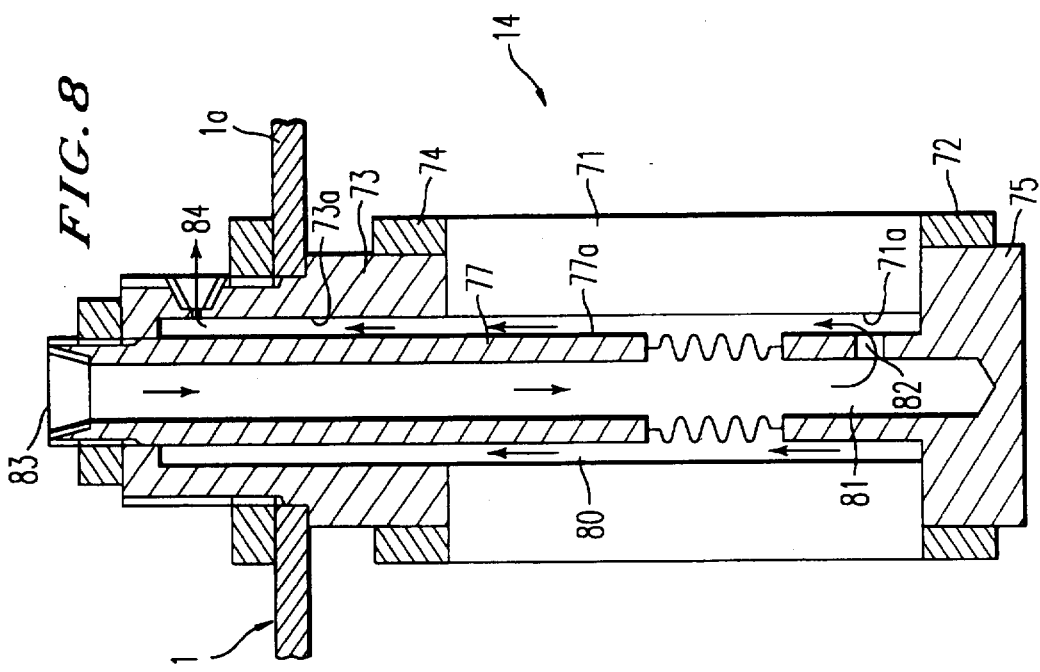
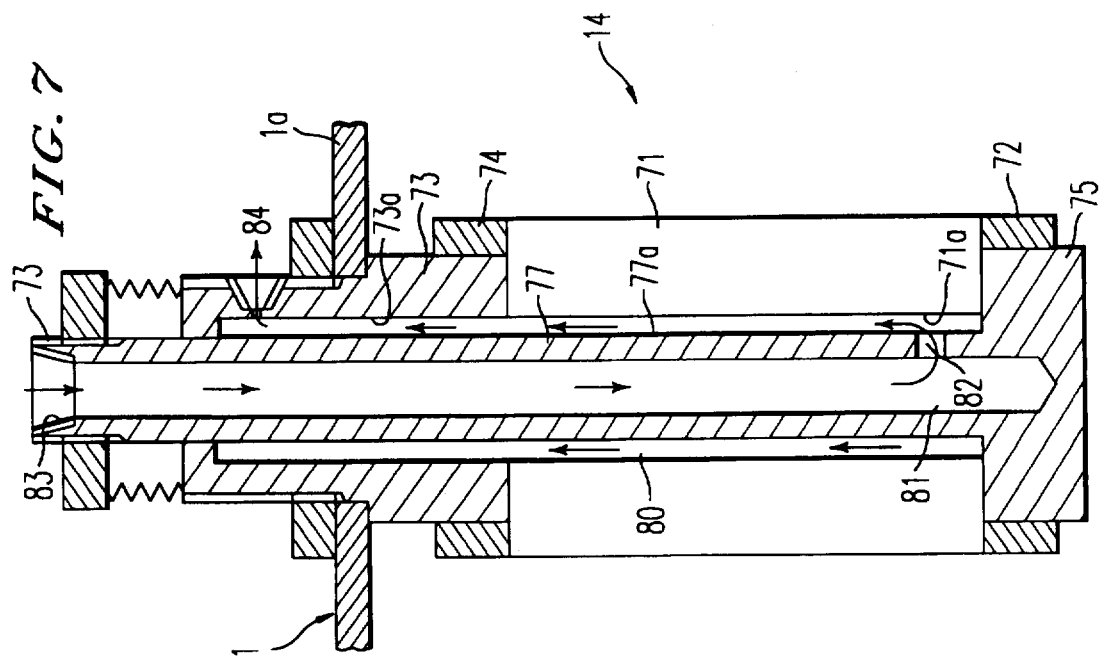

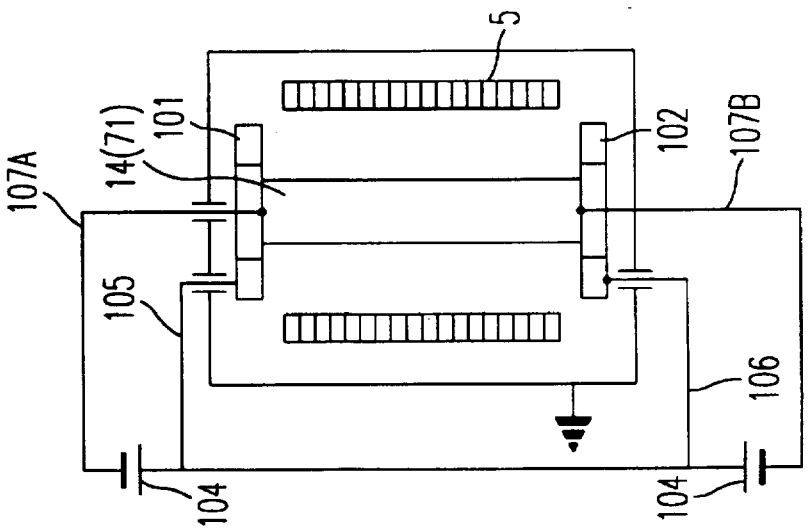
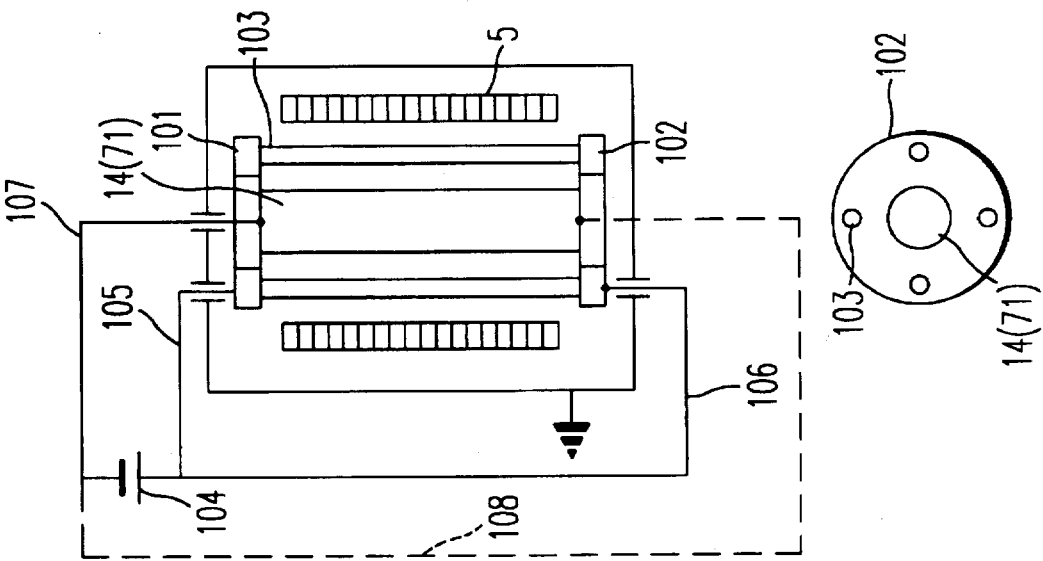

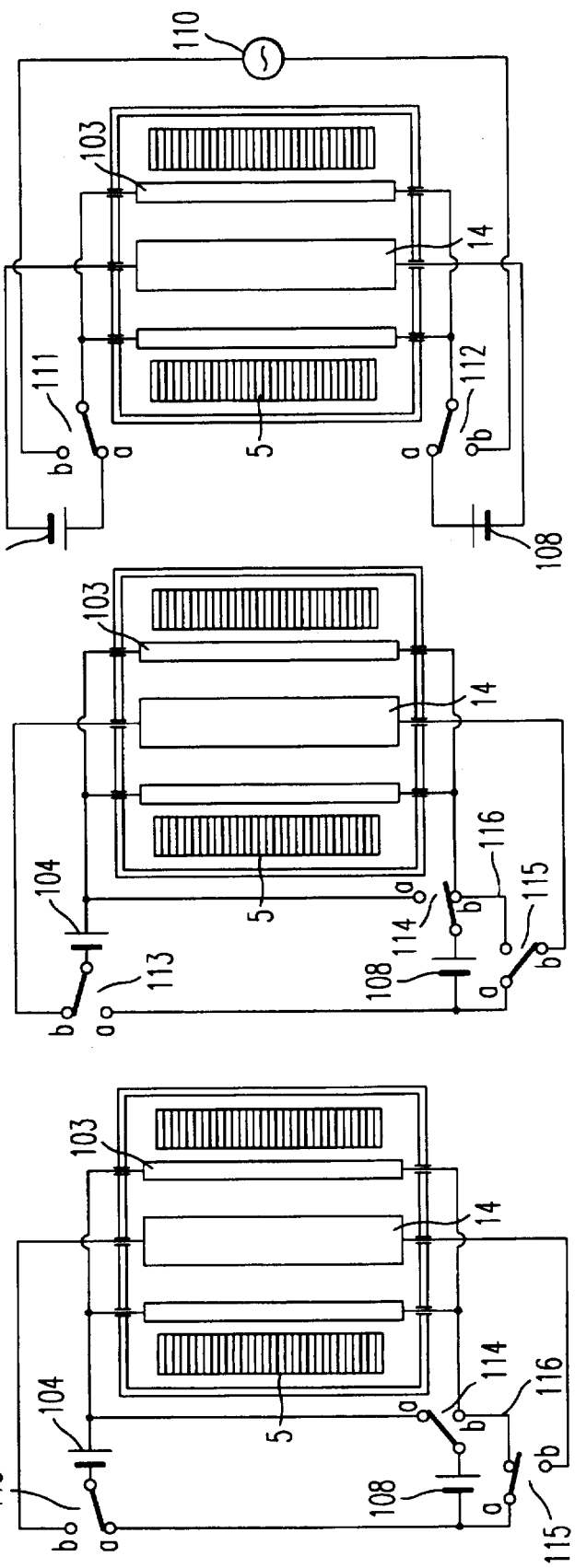

FIG. 21A
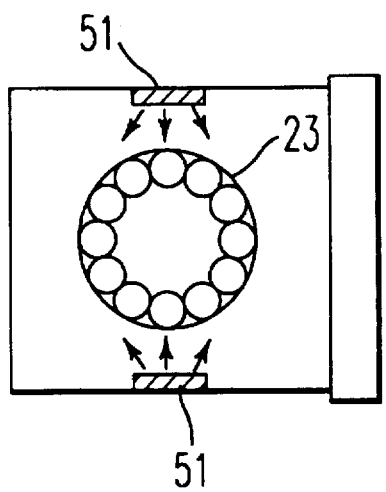
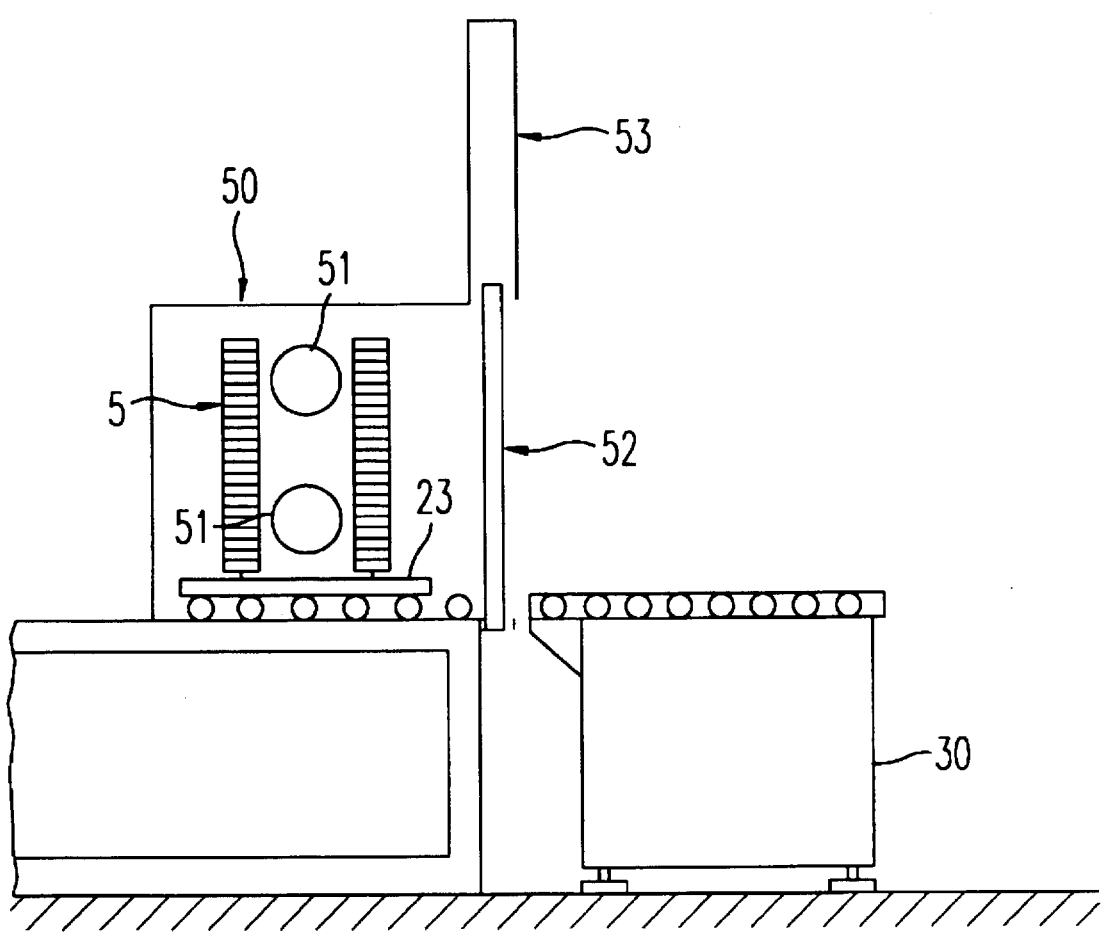
FIG. 21B

1

ARC ION PLATING DEVICE AND ARC ION PLATING SYSTEM

BACKGROUND OF THE INVENTION

1. Field of the Invention

The present invention relates to an arc ion plating device (hereinafter referred to as an AIP device), a coating device utilizing a vacuum arc discharge, and an arc ion plating system provided with the AIP device.

2. Description of the Related Art

An arc ion plating method is a method in which a vacuum arch discharge is generated between an anode and a cathode, a target, which are disposed in a vacuum chamber, and the cathode material is evaporated from the arc spots generated on the surface of the cathode, a solid body, and the vapor is accumulated on the surfaces of works disposed in the vacuum chamber to form a film on the works. AIP devices which realize an arc ion plating method are disclosed in Examined Japanese Patent Publication Nos. SHO 58-3033 and SHO 52-14690 by a snaper or suplef, and after that various kinds of improvements are done.

With the increasing demand for the application of the arc ion plating method as a technique of coating component parts for mass produced products with a hard film (for example, piston rings), it is considered to be an important subject to perform the coating of component parts with a hard film with high productivity.

A conventional AIP device for realizing high productivity, for example, an AIP device in which a work to be coated with a film is placed on a work table which can be freely taken into or taken out from a vacuum chamber is known to the public.

The basic constitution of such an AIP device as described in the above will be explained referring to FIGS. 23(a)–23(b) is a plan view and FIG. 23(b) is a longitudinal cross sectional view. There are an anode 2 and a flat-shaped evaporation source (a cathode) 3 which are fixedly provided and further works 5 which are placed on a work table 4 in a vacuum chamber 1. An arc power source 3a is connected to the anode 2 and the evaporation source 3, and when an arc discharge is generated between the anode 2 and the evaporation source 3 in a vacuum, a target material on the surface of the evaporation source 3 is instantaneously evaporated and spring out into a vacuum as metallic ions 6. The metallic ions 6 are accelerated by applying a bias voltage 7 to the works 5 and the metallic ions 6 are stuck to the surfaces of the works together with the reaction gas particles 8, and a fine hard film (TiN, TiC, TiCN, ZrN, Cr-N, etc.) is generated. The work table 4 has a built-in gear device which is to be in gear with a driving gear 9 for making the work 5 rotate in a direction "a" and at the same time the work table is also rotated to make the work 5 revolve. A shielding plate 12 having an opening in the radiating direction of the metallic ions 6 is provided inside the vacuum chamber 1.

Further, the vacuum chamber 1 comprises a door 10 and a rail 11. When the vacuum chamber 1 is released by the door 10, the work table 4 loaded with works 5 can be taken out along the rail 11 in the direction "c".

In the case of an AIP device, works are not handled one by one when they are taken into or taken out from the vacuum chamber 1, but a plurality of works are loaded on a work table beforehand and they can be taken into or taken out from the vacuum chamber 1 in a lot, so that the period of time for loading the works on the work table can be minimized, which is very beneficial for obtaining high productivity. An AIP device in which a film material can be evaporated uniformly and at a high speed from a flat evaporation source is disclosed, for example, in Unexamined Japanese Patent Publication No. HEI 4-224671. In the AIP device, a plurality of arc power sources are provided and power is supplied to each of the evaporation sources from each of the power supplies independently, and a high productivity is expected by uniformalizing the consumption of evaporation sources and making a high power operation possible.

Further, there is an AIP device in which the evaporation source is a rod shaped one, which is devised as a device being applicable to the use for the component parts as piston rings of which high productivity is required. Such an AIP device is paid attention because of the reason that the vapor of a film material is generated radially from the rod shaped evaporation source, so that a large number of works can be coated simultaneously with one evaporation source in disposing works as if they surround the evaporation source. Therefore, if a film material can be evaporated from the rod shaped evaporation source uniformly and at a high speed, the realization of high productivity may be possible.

In the case of an AIP device in which a rod shaped evaporation source is adopted works are disposed in the positions surrounding the evaporation source, so that, if the evaporation source is fixed in a vacuum chamber, when the works loaded on a work table are taken into or taken out from the vacuum chamber, the works and the evaporation source will interfere or collide with each other; therefore, it is impossible to take in or take out the works as shown in FIG. 23.

Accordingly, it can be considered to mount the rod shaped evaporation source itself on a work table; in that case, however, even if the interference or collision between the works and the evaporation source can be avoided, the film coating operation of high productivity by highly efficient generation of vapor with a large current discharge was not obtained because of a constitutional reason of the device such as the difficulty in the constitution of a cooling means of the evaporation source.

The AIP device disclosed in Unexamined Japanese Patent No. HEI 4-224671 is a device which corresponds only to a flat-shaped evaporation source, and nothing is mentioned about the application to an AIP device having a rod-shaped evaporation source.

Further, in the case of an AIP device shown in FIGS. 23(a) and 23(b), in general, the take-in or takeout of works is performed manually and also man power is indispensable for the exchange or the cleaning of the evaporation source, the anode or the shielding plate, and such a work is often performed simultaneously with the take-in or takeout of works. It requires a comparatively short period of time for the take-in or takeout of works but it requires much time for the exchange or cleaning of the evaporation source, the anode or the shielding plate, and moreover, since such a work cannot be performed in the nighttime, the whole AIP device has to be stopped for the execution of such a work. In other words, from the point of view of the operation rate, there is a problem for the realization of high productivity.

The present invention was invented in consideration of the above-mentioned circumstances, and an object of the present invention is to offer an AIP device and an AIP system with a rod-shaped evaporation source which is able to realize high productivity in handling works efficiently.

DISCLOSURE OF THE INVENTION

The present invention comprises a constitution as described in items (1) to (19).

(1) In an arc ion plating device having a rod-shaped evaporation source for generating an arc and works which are to be coated with a film and disposed in a state as if they surround the rod-shaped evaporation source, it is arranged in the AIP device according to the present invention that the works are capable of moving relatively for the rod-shaped evaporation source in the axial direction of the rod-shaped evaporation source.

(2) In an arc ion plating device having a vacuum chamber, a rod-shaped evaporation source, and works which are to be coated with a film and are disposed as if they surround the rod-shaped evaporation source, it is arranged in an AIP device according to the present invention that the vacuum chamber is composed of a lower lid on which the works are loaded and a main body on which the upper end of the rod-shaped evaporation source is fixed, and the lower lid is able to move up and down relatively for the main body.

(3) In the AIP device described in item (2), the lower lid is arranged to be able to ascend and descend for the main body.

(4) In the AIP device described in item (3), the works are arranged to be capable of moving horizontally for the lower lid after the upper ends of the works are positioned lower than the lower end of the rod-shaped evaporation source.

(5) In the AIP device described in item (4), the works are loaded on a work table placed on the lower lid, and the work table is arranged to be capable of moving horizontally for the lower lid with the function of a rack provided on the work table and a pinion provided on the lower lid.

(6) In the AIP device described in item (4), the works are loaded on a work table which is placed on the lower lid, and the shielding plate is loaded on the work table together with the works.

(7) In the AIP device described in item (6), an anode is also placed on a work table.

(8) In an arc ion plating device having a vacuum chamber, a rod-shaped evaporation source provided in the vacuum chamber, and works which are to be coated with a film and are disposed in a state as if they surround the rod-shaped evaporation source, it is arranged in the AIP device according to the present invention that the vacuum chamber is composed of a main body on which an end of the rod-shaped evaporation source is fixed and a lid body which supports the works and is capable of moving relatively for the main body in the axial direction of the rod-shaped evaporation source, and the other end of the rod-shaped evaporation source is connected to the lid body through an electrical connecting means which can be freely disconnected, and the arc electric power is supplied from both ends of the rod-shaped evaporation source.

(9) In the AIP device described in item (8), the electrical connecting means is so constituted that a plane member supported by the lid body can be abutted against the other end of the rod-shaped evaporation source through an elastic means.

(10) In the AIP device described in item (1), the rod-shaped evaporation source is composed of a target member of a hollow cylinder and it is supported by a shaft which is inserted through the center hole.

(11) In the AIP device described in item (10), an outside path is provided between the target member and the shaft, a center path is provided in the center of the shaft, and a lateral path which communicates the center path and the outside path is provided, and the rod-shaped evaporation source is cooled by the flow of a cooling medium through the lateral path, the outside path and the center path.

(12) In the AIP device described in item (11), the shaft has nuts for holding the target material, and the nuts hold the target member through an elastic body.

(13) In an arc ion plating device having a vacuum chamber, a rod-shaped evaporation source provided in the vacuum chamber, an anode which generates an arc between the rod-shaped evaporation source, and works which are to be coated with a film being disposed in a state as if they surround the rod-shaped evaporation source, an AIP device according to the present invention comprises ring-shaped anodes provided close to both end parts of the evaporation source.

(14) In an arc ion plating device having a vacuum chamber, a rod-shaped evaporation source provided in the vacuum chamber, an anode which generates an arc between the rod-shaped evaporation source, and works which are to be coated with a film and disposed in a state as if they surround the rod-shaped evaporation source, an AIP device according to the present invention comprises a rod-shaped anode being provided on a concentric circle with the rod-shaped evaporation source and positioned between the rod-shaped evaporation source and the works, and the arc electric power is supplied from both ends of the anode.

(15) In the AIP device described in item (13) or item (14), the arc electric power is supplied from both ends of the rod-shaped evaporation source.

(16) In the AIP device described in item (14), the anode is utilized as a heater for preheating works before coating operation of works with a film.

(17) An AIP system according the present invention comprises: a traveling flat car or a plurality of traveling flat cars for the take-in or the takeout of a work table loaded with works being able to travel along arc ion plating devices and being provided with a loading portion for loading the work table, and the loading portion is moved to a position facing an arc ion plating device with the travel of the flat car, and the work table can be freely taken in or taken out between the loading portion and the arc ion plating device.

(18) In the AIP system described in item (17), a traveling flat car is provided to be capable of traveling on a rail provided along the arc ion plating devices, and a turn table which can be loaded with a plurality of work tables is provided along the rail and an automatic exchange of work tables can be performed between the turn table and the traveling flat car.

(19) In an AIP system according to the present invention, rotary tables which are able to take in or take out work tables loaded with works to or from the arc ion plating devices and also able to change the directions of the work tables are provided in front of individual arc ion plating devices; a both way conveyer for conveying the work tables is provided which connects a plurality of rotary tables to each other; a first stocker which is able to store a plurality of work tables loaded with processed works is connected to a rotary table positioned at an end through a takeout conveyer; and a second stocker which is able to store a plurality of work tables loaded with unprocessed works is connected to a rotary table positioned at the other end through a take-in conveyer.

In the present invention related to item (1), when works are taken into or taken out from the vacuum chamber, the works can be moved relatively for the rod-shaped evaporation source in the axial direction of the rod-shaped evaporation source. Therefore, even if a rod-shaped evaporation source is adopted, works can be taken in or taken out without any interference or collision between the works and the rod-shaped evaporation source. In the result, an AIP device of high productivity can be realized in adopting a rod-shaped evaporation source and in processing a plurality works together.

In the present invention related to item (2), when works are taken into or taken out from the vacuum chamber, since the works can be moved up or down relatively, for the rod-shaped evaporation source, works can be handled without any interference or collision between the works and the rod-shaped evaporation source. Since the rod-shaped evaporation source is fixed in the vacuum chamber, when a work table for loading works is to be installed or when a mechanism concerning the installation of the rod-shaped evaporation source is to be installed, for example, when a cooling device for the rod-shaped evaporation source is to be installed, there is no need to install them in a concentrated state. Therefore, an AIP device of high productivity can be realized without making the constitution of a device a complicated one.

In the present invention related to item (3), a function of the lower lid to go up or down for the main body of the vacuum chamber is added to the invention described in item (2). If the main body of the vacuum chamber is to be moved, the constitutions of auxiliary facilities of the AIP device, for example, the constitution of a discharge nozzle may become complicated; however, if the lower lid is moved up or down, the above-mentioned problem can be avoided. Therefore, an AIP device of high productivity with a simple constitution can be realized.

In the present invention related to item (4), following function is added to the present invention related to item (3): works are moved horizontally after they are completely lowered in the outside of the main body of the vacuum chamber, so that works can be taken in or taken out without any interference or collision with the rod-shaped evaporation source. Therefore, efficient handling of works in an AIP device in which a rod-shaped evaporation source is adapted is made possible, which makes it possible to realize an AIP device of high productivity.

In the present invention related to item (5), the following function is added to the present invention described in item (4): works are handled on a work table and the work table is moved horizontally utilizing a rack and a pinion, so that works can be moved certainly. Thereby, in an AIP device of high productivity further accurate operation is made possible.

In the present invention related to item (6), the following function is added to the present invention described in item (4): a shielding plate is handled being loaded on a work table together with the works, so that even in a case where exchange or cleaning of the shielding plate is needed, it can be performed in the outside of the AIP device without stopping the operation of the device. Therefore, the operation of the AIP device can be continued independent of the exchange or cleaning of the shielding plate, which makes it possible to realize an AIP device of high productivity.

In the present invention related to item (7), the following function is added to the present invention described in item (6): an anode is also loaded on a work table, so that even when the exchange or cleaning of the anode is needed, similar to the case of the shielding plate, it can be performed in the outside without stopping the operation of the AIP device. Therefore, the operation of the AIP device can be continued independent of the exchange or the cleaning of the anode, which makes it possible to realize an AIP device of high productivity.

In the present invention related to item (8), an end of the rod-shaped evaporation source is fixed on the main body of the vacuum chamber and the other end is connected through an electrical connecting means which can be freely disconnected from the lid body, so that even though the lid body is made to be movable, the arc electric power can be supplied to the rod-shaped evaporation source from both end parts; thereby, a large current can be supplied to the rod-shaped evaporation source. Therefore, in an AIP device in which a rod-shaped evaporation source is adopted, high productivity can be realized by supplying a large arc electric power.

In the present invention described in item (9), the following function is added to the present invention described in item (8): a plane member supported by an elastic means is used for the electric connecting means, so that even when an inclination occurs in the connecting portion between the rod-shaped evaporation source and the electric connecting means, secure connection between them can be kept. Therefore, an AIP device of high productivity can be securely realized by supplying a large arc electric power securely to the rod-shaped evaporation source.

In the present invention related to item (10), the following function is added to the present invention described in item (1): since the rod-shaped evaporation source has a constitution in which the target member is supported with a shaft, it is possible to constitute a rod-shaped evaporation source having a free end, so that even when the target member of the rod-shaped evaporation source is consumed and the exchange is needed, the exchange work can be performed easily. Therefore, the period of time necessary for the exchange of the target members of the rod-shaped evaporation sources can be shortened and the operation rate of the AIP device can be upgraded, which makes it possible to realize an AIP device of high productivity.

In the present invention related to item (11), the following function is added to the present invention described in item (10): since it is so arranged that a cooling medium can be passed through the inside of the rod-shaped evaporation source, even when the temperature of the rod-shaped evaporation source is raised by the supply of a large arc electric power, it can be efficiently cooled. Therefore, evaporation speed can be increased by the supply of a large arc electric power to the rod-shaped evaporation source, which makes it possible to realize an AIP device of high productivity.

In the present invention related to item (12), the following function is added to the invention described in item (11): the target member is supported with nuts through an elastic body, so that the difference in the heat expansion between the target member and the shaft caused by the supply of power to the rod-shaped evaporation source and cooling of it can be absorbed by the elastic body. Therefore, there is no fear of the breakage of the target member by the difference in heat expansion between the target member and the shaft, which makes it possible to realize an AIP device of high productivity.

In the present invention related to items, (13) and (14), the anode is so arranged that no voltage difference is generated in the axial direction of the rod-shaped evaporation source, so that a uniform discharge in the axial direction can be generated. Therefore, a uniform coating can be executed, which makes it possible to realize an AIP device which is able to produce the coating of high quality.

In the present invention related to item (15), the following function is added to the present invention described in items, (13) and (14): since the arc power is supplied from both ends of the rod-shaped evaporation source, a large arc power can be supplied to the rod-shaped evaporation source, and there occurs no voltage difference in the axial direction of the rod-shaped evaporation source; thereby, a uniform discharge in the axial direction can be generated. Therefore, an AIP device of high productivity can be realized and the quality of the film on the surfaces of works can be further improved.

In the present invention related to item (16), the following function is added to the present invention described in item (14): since the rod-shaped anode can be used as a heater for preheating works, there is no need to provide a heater separately, and further the quality of the film on the works is not influenced by the film material or water vapor in the air stuck to the rod-shaped anode. Therefore, the quality of the film on the works can be improved further.

In the present invention described in items (17) to (19), since a work table loaded with works can be automatically taken into or taken out from an AIP device in an AIP system having more than a unit of AIP devices, there is no need to stop the operation of AIP devices in the nighttime. Therefore, it is made possible to realize an AIP device in which unattended operation in the nighttime is possible, operation rate is high, and productivity is high.

BRIEF DESCRIPTION OF THE DRAWINGS

FIGS. 2(a) and 2(b) show a work table being conveyed.

FIG. 3 shows a top view of an AIP system using a traveling flat car.

FIG. 7 is a cross sectional view of a further rod-shaped evaporation source.

FIG. 8 is a cross sectional view of a yet another evaporation source.

FIG. 14 shows yet another anode corresponding to a rod-shaped evaporation source.

FIG. 15 is a connection diagram between a rod-shaped evaporation source and an anode, and a power supply.

FIGS. 16(a)–16(b) show a connection diagram for an anode preheating.

FIG. 17 is another connection diagram for an anode preheating.

FIGS. 21(a)–21(b) show a side view of an AIP system relating to an AIP device with a gate valve.

DESCRIPTION OF THE PREFERRED EMBODIMENTS

Figure 1:
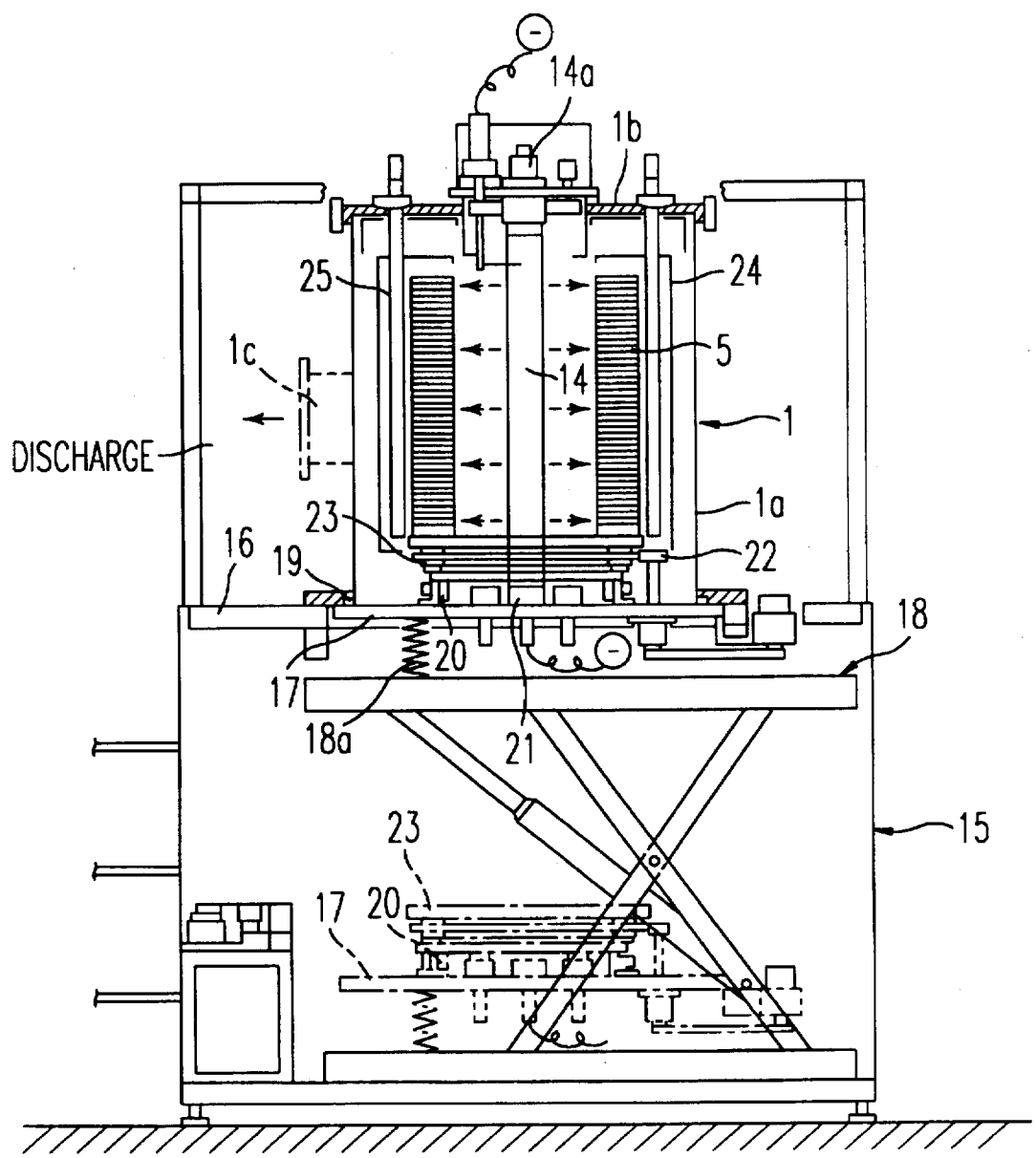
FIG. 1 shows a principal part of an AIP device according to the present invention.

An embodiment according to the present invention will be explained referring to the drawings. FIG. 1 shows the principal part of an AIP device according to the present invention.

In FIG. 1, a main body 1a of a vacuum chamber 1 is fixed on the second floor part 16 of a frame 15, and a discharge nozzle 1c is provided protrusively on the side surface of the main body 1a, and the bottom of it is opened. A lower lid 17 which is a lid body for opening and closing the opening portion of the main body 1a of the vacuum chamber 1 is supported elastically on a lifter 18 through a spring 18a, and following the ascent or descent of the lifter 18, it is able to ascend or descend between the lower position shown with a 2-dot chain line and the upper position shown with a full line. When the lower lid 17 is in the upper position, the vacuum chamber 1 is made to be air tight by a special seal. When the lower lid 17 is supported through an elastic body such as a spring 18a, it is easier to obtain a complete air tight state. A rod-shaped evaporation source is protrusively provided downward from the center of an upper lid 1b of the vacuum chamber 1, and at the upper end of the rod-shaped evaporation source, an upper minus terminal 14a to be connected to the cathode of the arc power source (not shown in a drawing) is fixedly provided. A roller rail 20, a means for the horizontal movement of works 5, composed of a driven roller train, a lower minus terminal 21 to be connected to the cathode of the arc power source, and a driving gear 22 are provided on the lower lid 17. The work table 23 to be loaded with works 5 is placed on the lower lid 17 through the roller rail 20, and it can be conveyed in the thickness direction of the paper to your side rolling over the roller rail 20, and it can make, the works 5 rotate and revolve with a driving gear 22. When the lower lid 17 is in the upper position shown with a full line, the lower minus terminal 21 is connected to the lower end of an evaporation source 14, and a continuous discharge is generated from the surface of the rod-shaped evaporation source 14 ranging in full length. A shielding plate 24 is loaded on the work table 23 and it is conveyed with the works. 5. An anode (not shown in a drawing) corresponding to the rod-shaped evaporation source 14 can be loaded on the work table 23. A reference numeral, 25, shows a heater to be used for preheating works 5.

Next, a conveyance procedure of the work table 23 in an AIP device having a constitution as described in the above will be explained referring to FIGS. 2(a)–2(b).

At first, in FIG. 2(a), when the lower lid 17 is descended by the lift 18, the work table 23, placed on the roller rail 20, is descended in an arrow direction "c" in a state where it is loaded with the works 5, the shielding plate 24, and/or the anode, and the rod-shaped evaporation source 14 goes apart from the works 5. A reference numeral 30 is a traveling flat car, and a roller rail 31 is fixed to it.

In succession to the above, in FIG. 2(b), the work table 23 is taken out as shown by an arrow "d" onto the traveling flat car 30 driven by the roller rails, 20 and 31. It is possible to make the main body 1a of the vacuum chamber 1 descend or ascend without making the lower lid 17 descend or ascend (On this point, detailed explanation will be given later.); however in that case, the constitution of the device becomes complicated, for example, a flexible hose has to be connected to the discharge nozzle 1c, etc., so that it is desirable to make the lower lid descend or ascend.

In the AIP device as described in the above, works 5 can be moved relatively for the rod-shaped evaporation source 14 in the axial direction of it (In the embodiment shown in FIGS. 1 and 2, the relative movement in the vertical direction is performed by the ascent or descent of the lower lid 17 on which a work table 23 is placed.). When the work table 23 is moved horizontally being loaded with works 5, the works 5 and the rod-shaped evaporation source 14 can be made to be apart from each other by enough of a distance by the above-mentioned relative movement to be able to avoid the interference or collision between them. After that, the work table 23 loaded with the works can be conveyed in the horizontal direction. Therefore, in an AIP device in which a rod-shaped evaporation source 14 is adopted, efficient handling of the works 5 by the work table 23 can be performed, which makes it possible to realize a device of high productivity.

Further, the rod-shaped evaporation source 14 is fixed to the main body 1a of the vacuum chamber 1, not to the work table 23. Thereby, it is made possible to avoid the problem which occurs when the rod-shaped evaporation source 14 is fixed to the work table 23 which moves up or down, such as the difficulties in installing a cooling device, etc. for the rod-shaped evaporation source.

In a case where a device is so constituted that the shielding plate 24 and the anode are conveyed on the work table 23 together with the works 5, when it is necessary to exchange or clean the shielding plate 24 or the anode, such a work can be performed outside the AIP device, so that there is no need to stop the operation of the device for such a work, which makes it possible to realize a device of high productivity. The above-mentioned constitution can be applied to a conventional AIP device using a flat-shaped evaporation source.

Figure 4A:
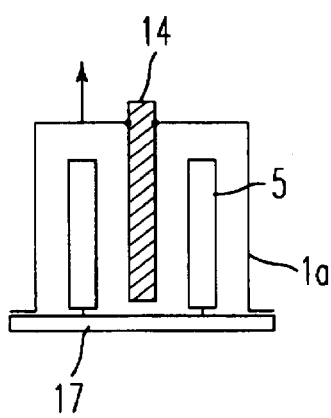
FIGS. 4(a)–4(e) show an example of a relative movement between works and a rod-shaped evaporation source.
Figure 4B:
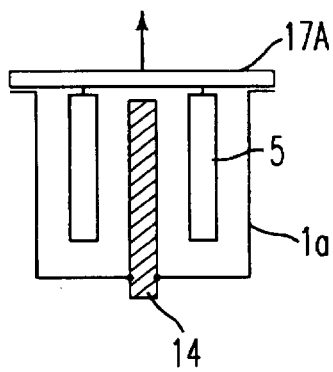
Figure 4C:
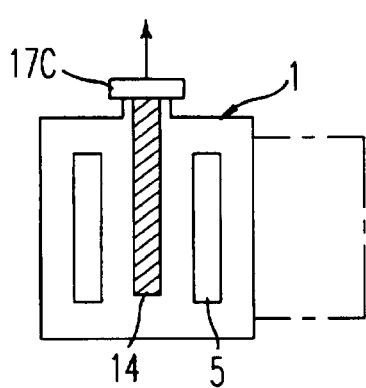
Figure 4D:
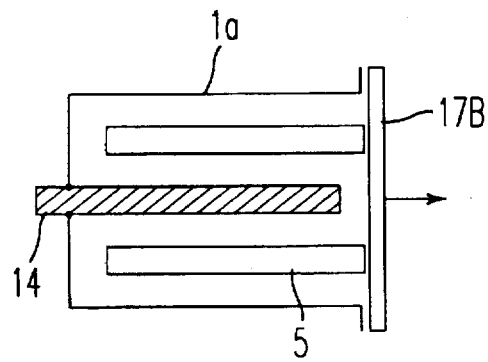
Figure 23A:
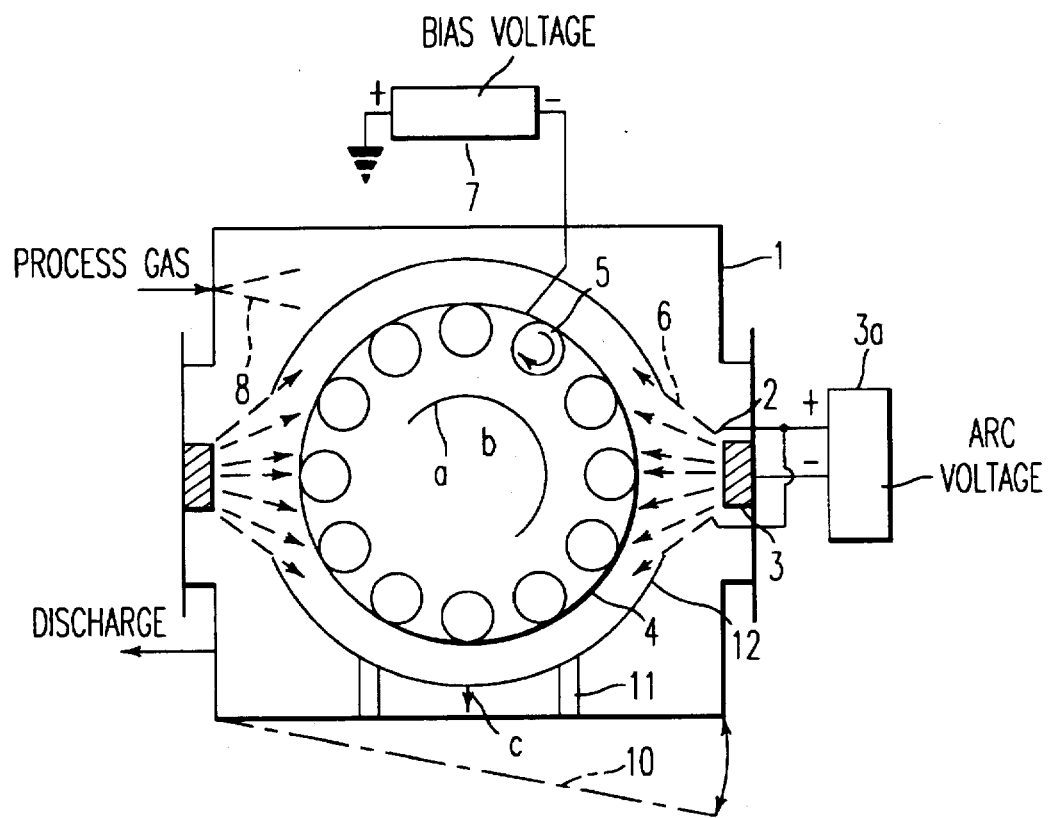
FIGS. 23(a)–23(b) show a principal part of a conventional AIP device.
Figure 23B:
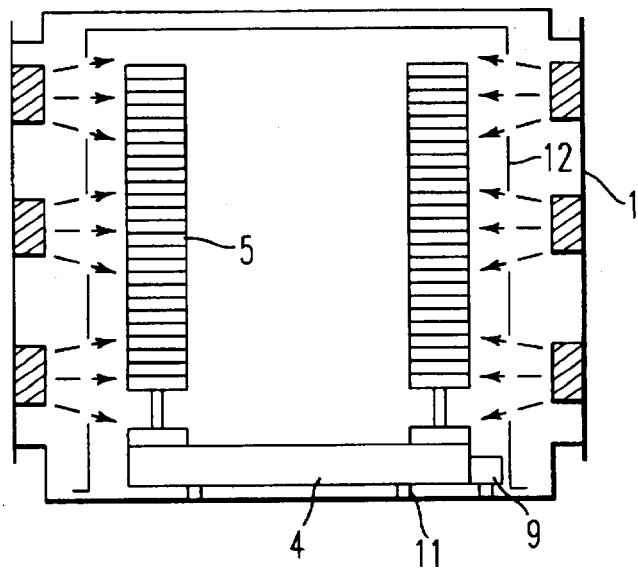

Metallic ions evaporated from a rod-shaped evaporation source irradiate the works 5 radially, so that the capture rate of vapor is higher in comparison with the capture rate in the case of a flat-shaped evaporation source, and the yield of about 80% can be expected. The yield in the case of a flat-shaped cathode 3 as shown in FIGS. 23(a)–23(b) is generally less than 50%. Since the rod-shaped evaporation source has a simple column shape or a cylinder shape, its weight can be several tens of kg, while the weight of the flat-shaped cathode shown in FIGS. 23(a)–23(b) is several kg at the maximum, so that the manufacturing cost of a target member, in the case of a rod-shaped evaporation source 14 is expected to be less than ¼ in comparison with the cost in the past. The effective cost per gram of the target can be remarkably reduced. The mode of the relative movement of the works 5 for the rod-shaped evaporation source 14 is not limited to those in FIGS. 1 and 2(a)–2(b), and various kinds of modifications may be possible. For example, as shown in FIG. 4(a), the constitution may be such in which the main body 1a of the vacuum chamber 1 and the rod-shaped evaporation source 14 are moved for the works 5 and the lower lid 17. In the constitution shown in FIG. 4(b), an upper lid 17a which hangs the works 5 is ascended or descended for the main body 1a of the vacuum chamber 1 and the rod-shaped evaporation source 14. In the constitution shown in FIG. 4(c), the vacuum chamber 1 is provided with a door (a portion written with a 2-dot chain line), which can be freely opened or closed, for taking in or taking out the works 5, and the rod-shaped evaporation source is ascended and descended with a small lid body 17C for the vacuum chamber 1. In the constitution shown in FIG. 4(d), a rod-shaped evaporation source 14 is provided protrusively in the horizontal direction on the main body 1a of the vacuum chamber 1 which is turned sideways, and for these mentioned in the above, a side lid 17B is moved together with the works 5 in the horizontal direction.

Figure 4E:
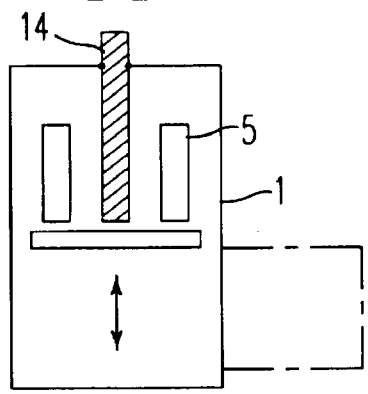

In the constitutions shown in FIG. 1 and FIGS. 4(a), 4(b), 4(c) and 4(d), in the case of a relative movement of the rod-shaped evaporation source 14 or the lid bodies (lower lid 17, upper lid 17A and side lid 17B), an opening portion is provided on the vacuum chamber 1 on the free end side of the rod-shaped evaporation source 14, and a relative movement is performed between the lid body at the opening portion and the main body 1a of the vacuum chamber 1. On the other hand, in the constitution shown in FIG. 4(e), a lid body which moves relatively for the main body 1a of the vacuum chamber 1 is not provided, and a relative movement is performed between the rod-shaped evaporation source and the works 5 in the vacuum chamber 1 to avoid the interference between the rod-shaped evaporation source 14 and the works 5, and after that, the works 5 are taken in or taken out through the door provided on the side surface of the vacuum chamber 1; in such a constitution, there is a problem that the vacuum chamber 1 may become a large sized one. Therefore, it is desirable that a lid body is provided on the main body 1a on the free end side of the rod-shaped evaporation source 14, and a relative movement is performed between the lid body and the main body 1a of the vacuum chamber 1.

As described in the above, an end of the rod-shaped evaporation source 14 is a fixed end and the other end is an free end. Various kinds of examples of such rod-shaped evaporation sources will be explained referring to FIGS. 5 to 8. FIGS. 5 to 8 are cross sectional views of a rod-shaped evaporation source to be applied to FIG. 1.

Figure 5:
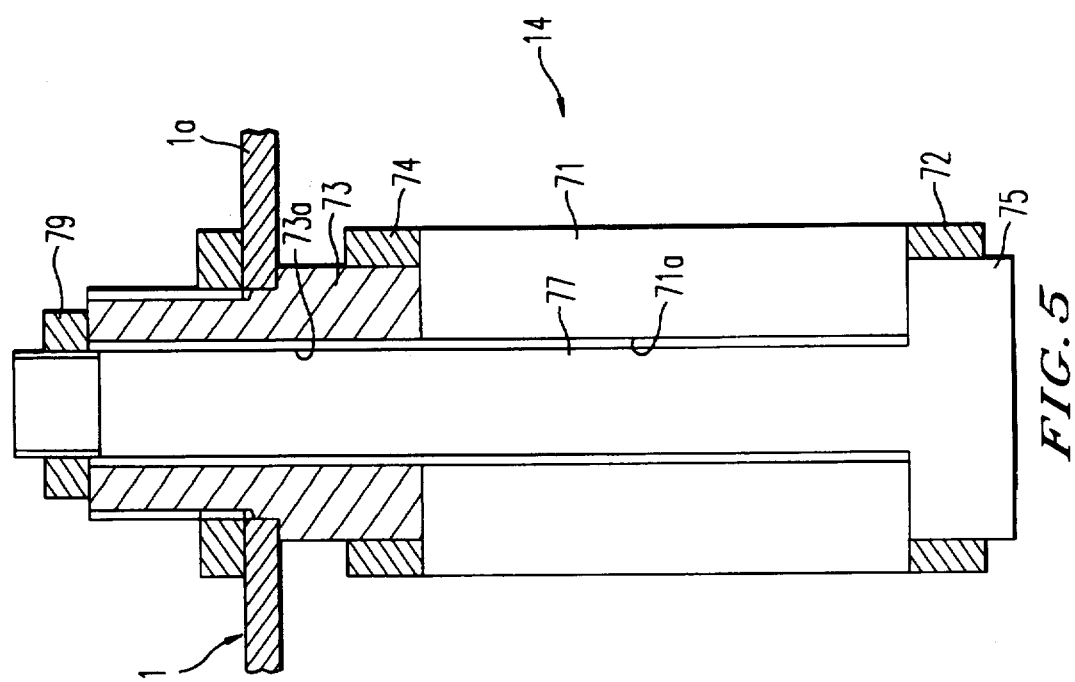
FIG. 5 is a cross sectional view of a rod-shaped evaporation source.

In FIG. 5, a target member 71 of the rod-shaped evaporation source 14 is formed into a hollow cylinder. On the lower end of the target member 71, a lower arc confinement ring 72 having the same diameter as that of the target member 71 is fixed. There is a target supporting portion 73 on the upper end of the target member 71, and an upper arc confinement ring 74 which has the same outer diameter with the rod-shaped evaporation source is fixed on the outer periphery side of the target member 71. In order to insulate the arc confinement rings, 72 and 74, from the target member they are fixed to the target holding portion 73 or shaft 77 through insulators, but the description about the detailed constitution will be omitted. Center holes, 71a and 73a, are provided in the target member 71, lower arc confinement ring 72, and the target holding portion 73, and the shaft 77 is inserted into these center holes. The target member 71 is fixed with a flange 75 of the shaft 77 and a nut 79 through the target holding portion 73. Owing to such a constitution in which the target member 71, the shaft 77 and the target holding portion 73 are fixed with one nut, the work for making screw holes on the target member to fix the flange 75 which holds the free end of the target can be omitted and also when the target member 71, a kind of the consumables, is to be changed, mounting/demounting of it can be performed easily.

Figure 6:
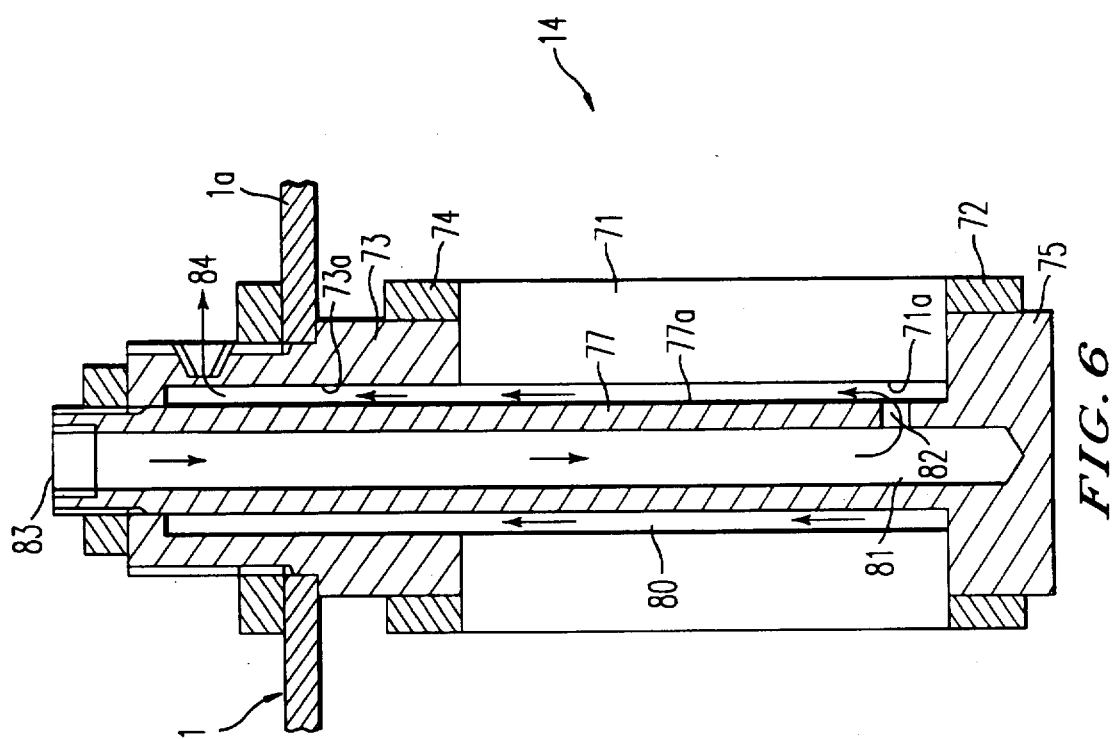
FIG. 6 is a cross sectional view of another rod-shaped evaporation source.

FIG. 6 shows an example of a constitution in which a rod-shaped evaporation source 14 shown in FIG. 5 heated by the power supplied from the arc power source can be efficiently cooled. The inner diameters of center holes, 71a, 72a and 73a, is larger than the outer diameter of the shaft 77, and an outer path 80 is formed on the shaft 77 on the side of the outer periphery 77a. A central path 81 is formed in the center of the shaft 77, and at an end of the central path a connecting port 83 for the input of a cooling medium is opened to be capable of being connected to an external piping, and the other end is closed. A lateral hole 82 which communicates with the outer path is opened on the closed end side of the central path, and a connecting port for discharge 84 is opened in a part of the target holding portion 73 along the outer path 80 being outside the main body 1a of the vacuum chamber 1. The cooling medium from the input connection port 83 flows from the upper part to the lower part through the central path 81 and passes the lateral path 82 and flows from the lower part to the upper part through the outer path 80 and reaches the discharge connecting port 84. The cooling medium from the input connection port 83 flows at a predetermined speed inside the central hole 71a of the target member without any stagnation, so that an efficient cooling with a high heat conductivity can be performed; thereby, the evaporation speed can be increased by supplying a large electric power to the rod-shaped evaporation source 14.

FIG. 7 shows an example of a constitution of a rod-shaped evaporation source 14 which is able to absorb heat stress caused by a temperature difference. The shaft 77, which sends out a cooling medium to the tip of it, is in a low temperature, but the target member 71 is in a higher temperature than that of the shaft 77. The target member 71 elongates much in the axial direction but the shaft 77 elongates a little in the axial direction, so that a large compression stress is applied to the target member 71 and there has been a fear of breakage. Therefore, an elastic body, for example, a compression spring 78 is placed between the nut 79 for common clamping and the target holding portion 73 to make the compression spring 78 absorb the difference in heat expansion. Then, only a compression stress decided by the pressure given by the compression spring 78 is applied to the target member 71, so that there is no fear of breakage. A rubber plate, etc. can be used in place of the compression spring 78.

FIG. 8 shows another example of a constitution for absorbing the heat stress. The shaft 77 is divided into several pieces in the axial direction, and between the divided pieces, for example, a bellows 85 is inserted as an elastic body. The bellows 85 is something like a spring made with a plurality of plate springs connected mutually, and it generates a predetermined compressive force, and it can be a path for a cooling medium. When it is applied to a rod-shaped evaporation source 14 as shown in FIG. 5 in which paths for cooling medium are not provided, a spring, a rubber plate, etc. can be used as an elastic body.

In order to realize an AIP device of high productivity, it is necessary to supply a large arc current to the evaporation source and to generate a continuous arc. In order to supply a large arc current to a rod-shaped evaporation source and to generate a continuous arc, it is very effective to supply an arc current from both ends of the rod-shaped evaporation source. Since the lower end of the rod-shaped evaporation source 14 according to the present invention described in the above is a free end, an electrical connecting means which can be freely disconnected is provided on the lower end of it to supply an arc current from both ends of the rod-shaped evaporation source 14 (through upper and lower minus terminals, 14a and 21. in FIG. 1). The example of the electrical connecting means will be explained referring to FIGS. 9 and 10.

Figure 9:
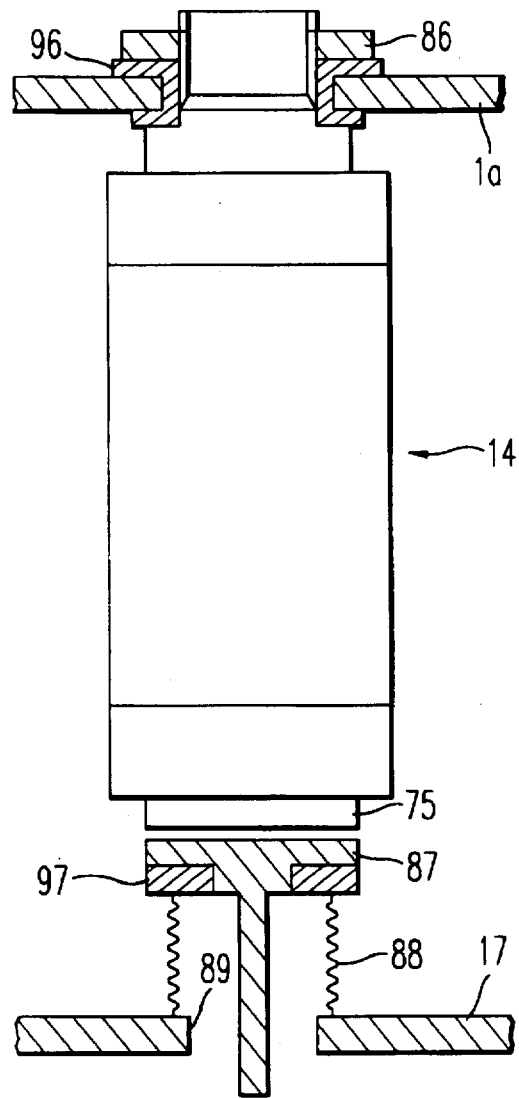
FIG. 9 shows an electrical connecting means for a rod-shaped evaporation source.

In FIG. 9, the upper end of the evaporation source 14 is fixed with a nut 86 through an insulating member 96 on the main body 1a of the vacuum chamber 1, and the lower end of the evaporation source 14 is arranged to be a free end which can be detached by the open/close of the lower lid 17. The electrical connecting means is constituted with a plane member 87 which performs plane contact with the flange 75 of the shaft 77 and is provided in standing up on the lower lid 17 through an insulating member 97 and an elastic means (a flexible flange in FIG. 9). The plane member 87 corresponds to the lower minus terminal 21 in FIG. 1. The flexible flange 88 can be freely elongated or compressed bearing the inner pressure of the air and has a certain elasticity, and the inside of it communicates with the open air through an opening formed on the lower lid 17. When the inside of the main body 1a of the vacuum chamber 1 is evacuated, the atmospheric pressure acts on the inside of the flexible flange 88 and presses the plane member 87 against the flange 75. Proper plane pressure can be secured on the plane contact portion owing to the atmospheric pressure and the elasticity of the flange 88 itself. Even when the rod-shaped evaporation source 14 is slanted a little and the flange 75 is not placed horizontally, the plane member 87 which is supported by the flexible flange 88 is capable of being parallel to the flange 75 to keep good contact to it; thereby, heating by a local contact can be avoided. In the embodiment explained in FIGS. 4(a)–4(e), the detachment of the electrical connection is performed with the downward movement of the lower lid 17. When the lower lid 17 is moved downward, the plane member 87 is made to move apart from the flange 75. When the lower lid 17 is moved upward the plane member is abutted against the flange 75 to form a plane contact portion, which makes it possible to supply a large current to the target member and to realize high productivity.

Figure 10:
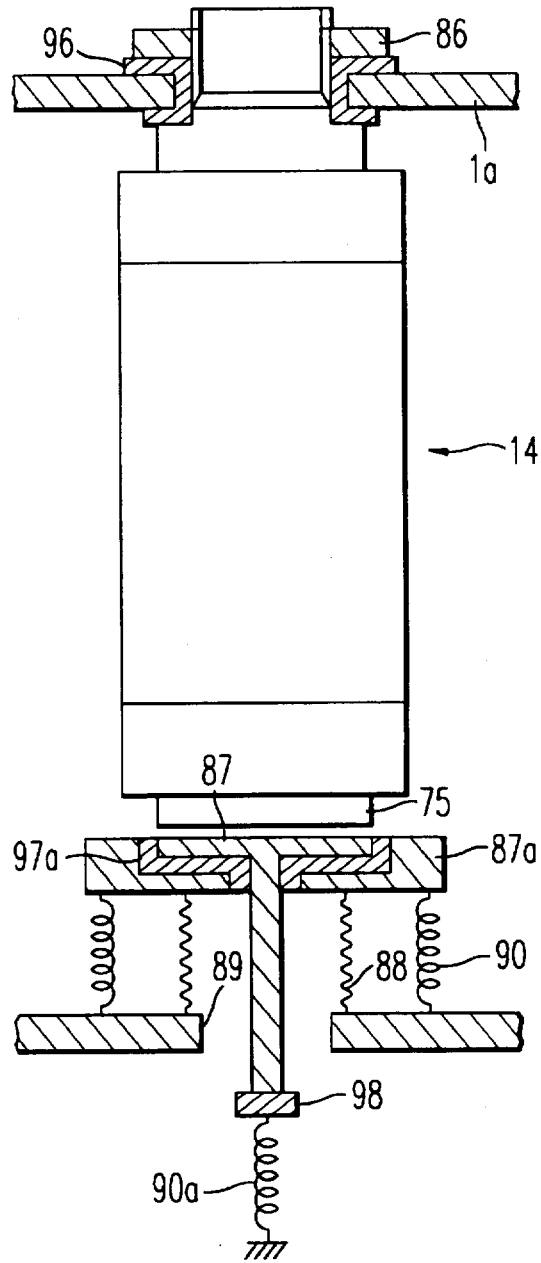
FIG. 10 shows an electrical connecting means for another rod-shaped evaporation source.

In order to make a large current flow, a large plane pressure is needed in the plane contact portion, and if such a large plane pressure could not be obtained in the constitution as shown in FIG. 9, an additional elastic means can be used as shown in FIG. 10. In other words, the plane member 87 is made to be supported by a wide holding member 87a through an insulating member 97a, and when compression springs 90, for example 4 pieces of springs 90, are disposed on boundary positions between equally divided portions on a circle, the force of the compression springs 90 will contribute to the increase in the plane contact pressure. Further it is also possible to press the plane member 87 toward the flange 75 by providing a compression spring 90a on the lower end of the plane member 87 through an insulating member 98. Each of these springs can be used independently from each other, and if necessary, they can be used being combined as shown in the figure.

As described in the above, high productivity can be realized by making a large arc current flow through the rod-shaped evaporation source in the constitution as shown in FIGS. 9 and 10. When a uniform arc is not generated in the axial direction of the rod-shaped evaporation source, unevenness in the coating of works occurs; thereby, it is effective to devise the disposition of an anode for the rod-shaped evaporation source. In a case where an anode is disposed around the evaporation source, the anode can make a shadow on the works disturbing the metallic ions emitted toward the works, so that it is necessary to pay attention to the disposition of an anode not to affect much influence on the works. The examples of anode dispositions with which an approximately uniform arc in the axial direction can be obtained and still the degree of interruption for the works is small will be explained referring to FIGS. 11 to 15. The examples shown in FIGS. 11 to 14, are general examples of anode dispositions in the devices, in each of these devices an arc current is supplied from an end. The example shown in FIG. 15 is a concrete example in which the above-mentioned idea is applied to an AIP device in which an arc current is supplied from both ends of a rod-shaped evaporation source.

Figure 11:
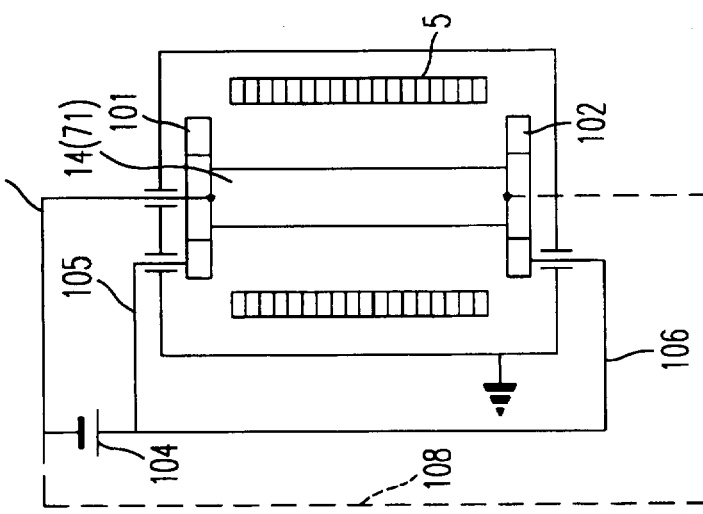
FIG. 11 shows an anode corresponding to a rod-shaped evaporation source.

In FIG. 11, ring shaped anodes, 101 and 102, are disposed in upper and lower symmetrical positions about the center of the target member, the positions are off the rod-shaped evaporation source, in particular, the target member 71. Both ring-shaped anodes, 101 and 102, are connected to a power supply 104 with wirings, 105 and 106, in parallel. An end of the rod-shaped evaporation source 14 is connected to the power supply 104 with a wiring 107. In the constitution as described in the above, the ring-shaped anodes, 101 and 102, disposed in the symmetric positions upper and lower are effective to generate an arc being uniform in the axial direction of the evaporation source 14, and also the ring-shaped anodes, 102 and 103, do not make shadows on the works, which makes it possible to perform coating of works without unevenness. In the figure, as shown in with a broken line, in the case of a cathode side too, it is desirable to supply currents from both end parts. The same thing as described in the above can be said in the examples in FIGS. 12, 13 and 14.

Figure 12:
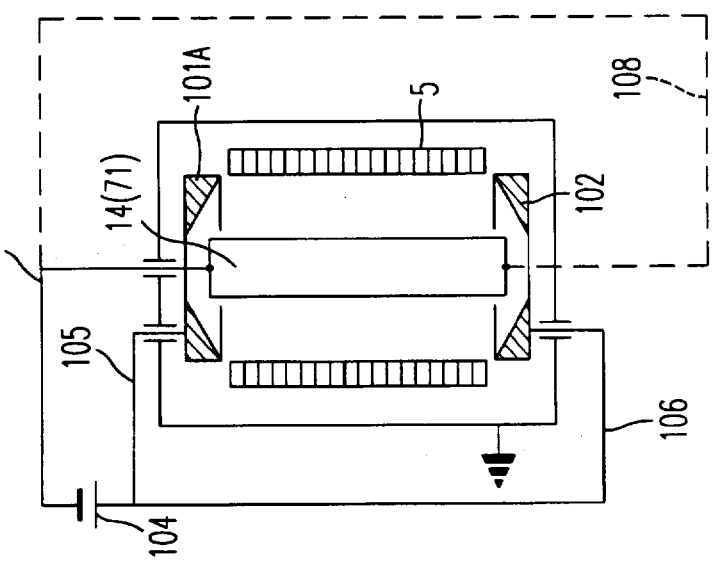
FIG. 12 shows another anode corresponding to a rod-shaped evaporation source.

The ring-shaped anodes, 101 and 102, shown in FIG. 11 are simple ring-shaped plates, but as shown in FIG. 12, when they are made to be ring-shaped anodes of dish types with conical surfaces, 101A and 102A, an arc generated on the surface of the target member 71 of the rod-shaped evaporation source 14 can be spread easily to the central part of the rod-shaped evaporation source 14, and the arc which is apt to be partial toward the end parts is controlled to be a uniform arc in the axial direction of the rod-shaped evaporation source 14.

Figure 13:
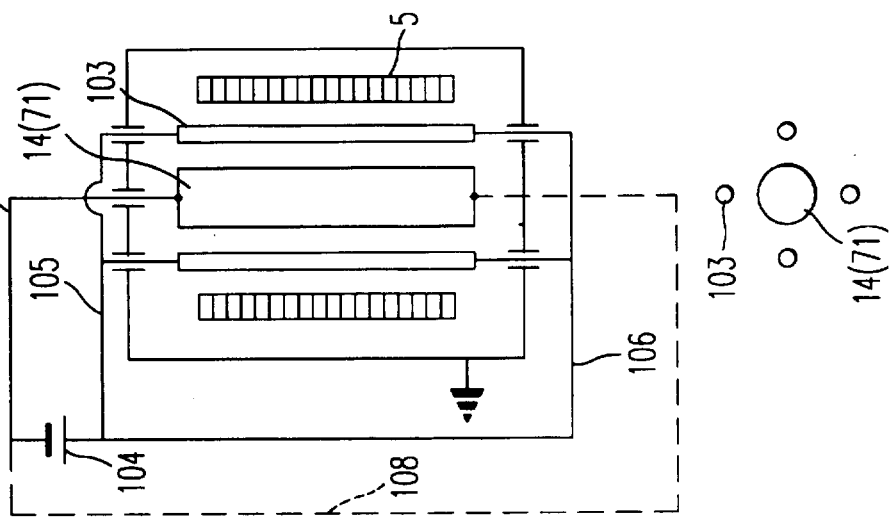
FIG. 13 shows a further anode corresponding to a rod-shaped evaporation source.

The anode 103 shown in FIG. 13 is composed of rods disposed in the equally divided portions on a circle divided by an arbitrary number, (In the example shown in the figure, the circle is divided into quarters.) the circle which is concentric with the rod-shaped evaporation source 14 being located between the rod-shaped evaporation source 14 and the works 5. Individual rods of the rod-shaped anode are connected to the power supply in parallel with wirings, 105 and 106. An end of the rod-shaped evaporation source 14 is connected to the power supply 104 with a wiring. 107. In the case of the rod-shaped anode 103, the anode rods can be uniformly disposed in the radial direction and the axial direction, so that the partiality of an arc becomes small. The rod-shaped anode 103 is positioned between the rod-shaped evaporation source 14 and the works 5, so that the shadow is given to the works 5; however, the works 5 are arrange to revolve around the rod-shaped evaporation source 14 being rotated, so that the unevenness in the coating on the works 5 does not occur. In the present example, it is also desirable to supply the power from both end parts of the cathode with a wiring 108.

The anode shown in FIG. 14 is a combined anode in which the ring-shaped anodes, 101 and 102, shown in FIG. 11, and the rod-shaped anode 103 shown in FIG. 13 are combined. The uniformity of arc in the axial direction is improved by the proper combination of anode constitutions. The rings and the rods are made into a unity, so that the wirings, 105 and 106, may be connected to the ring portion only.

FIG. 15 shows an example in which the anode shown in FIGS. 11 to 14, is applied to the rod-shaped evaporation source 14 of the present invention. Both ends of the rod-shaped evaporation source 14 are connected to the power supplies, 104 and 104, with wirings, 107A and 107B, respectively for the supply of arc currents. According to such a constitution as described in the above, large arc currents are supplied from both ends of the rod-shaped evaporation source 14, which contributes high productivity of the device, and also the potential difference in the axial direction of the rod-shaped evaporation source 14 is decreased, and further the effect explained in FIGS. 11 to 14, is added to it, so that the uniformity of an arc in the axial direction can be improved further. In a device according to FIG. 15, the currents which flow through both end parts of the evaporation source and the anode can be controlled more precisely, which makes it possible to achieve more accurate uniformity of an arc.

In the constitution of an anode, besides the ring-shaped anodes, 101 and 102, as shown in FIG. 15, the rod-shaped anode 103 may be used as shown in the preceding page or a combination of them may be used. When the rod-shaped anode 103 is applied to an AIP device according to the present invention, it is desirable to make an end free and use an electrical connecting means similar to the case of the rod-shaped evaporation source 14.

In a case where a rod-shaped anode 103 is used which is disposed between the rod-shaped evaporation source 14 and the works 5, a lot of film material is attached to the rods. Since the rod-shaped anode is kept in a low temperature by water cooling, the attached film can be exfoliated or separated, or the moisture in the atmosphere, etc. attached on the film on the anode while the vacuum chamber 1 is opened to the atmosphere can be released, which may exert a baneful influence on the quality of the film on the works. Therefore, it is desirable to release the moisture, etc. attached on the surface of the rod-shaped anode 103 by utilizing it as a heater for preheating the works 5 before the coating operation is started, and to keep the anode in a high temperature to control the exfoliation or separation of the film on the anode in the coating operation.

FIGS. 16(a)–16(b) shows a state where the power supplies, 104 and 108, for an arc discharge are used as a power supply for preheating the rod-shaped anode 103. FIG. 16(a) shows a state of preheating, and FIG. 16(b) shows a state of electric discharge. In addition to a circuit necessary for electric discharge, changeover switches, 113, 114 and 115, and a bias circuit 116 are shown in the figure. Reference numerals, 104, 108, 113, 114, 115 and 116 constitute a preheating means. As shown in FIG. 16(a), when the switches 113, 114 and 115 are on the side of "a" contact points, the power supplies, 104 and 108, are connected to the rod-shaped anode 103 in parallel, and the rod-shaped anode is used as a heater for preheating the works 5. Therefore, it is not needed to provide a heater separately, and also the moisture, etc. attached on the film of the rod-shaped anode 103 can be released in a preheating operation, so that it makes it possible to avoid a baneful influence caused by the release of the moisture, etc. in a coating operation which exerts on the quality of the film on a work 5. When the preheating is finished, the switches, 113, 114 and 115, are changed over to "b" contact points to perform normal coating operation. During the coating operation the rod-shaped anode is kept in a high temperature, so that the film on the anode is not easily exfoliated or released.

In FIG. 17, an AC power supply 110 to be used when the anode is utilized as a heater is provided separately from the DC power supplies, 104 and 108, to be used for the vacuum arc discharge. Switches, 111 and 112, are provided between the AC power supply circuit and the DC power supply circuit for changing over the connection to the rod-shaped anode 103. When the switches, 111 and 112, are switched to "a" contact points, the rod-shaped anode 103 is connected to the DC power supplies, 104 and 108, for a normal coating operation. Before the coating operation, when the switches, 111 and 112, are changed over to "b" contact points, the rod-shaped anode is connected to the AC power supply 110, and the works 5 are preheated by the rod-shaped anode 103 acting as a heater. When a conventional flat-shaped evaporation source is used, the partiality of the arc can be reduced by providing a rod-shaped anode in front of the flat-shaped evaporation source. In such a case, the rod-shaped anode may be also used as a preheater as explained referring to FIGS. 16(a)–16(b) and FIG. 17.

As described in the explanation of FIG. 1 and FIG. 2, when the works 5 are taken out, the work table 23 can be moved horizontally on the lower lid 17. In the embodiment shown in FIG. 1 and FIG. 2, a roller rail is provided as a means for the horizontal movement; however, since the inside of the vacuum chamber 1 is evacuated, it is desirable to provide a constitution which makes (a) secure vacuum seal possible and also makes secure driving of the work table 23 possible. Further, after the work table is conveyed into a predetermined position on the lower lid 17, the prevention of positional slippage in the horizontal direction is needed, independent of the up or down movement of the lower lid 17, from the point of view of stabilizing the contact of the electrical connecting means.

Figure 18:
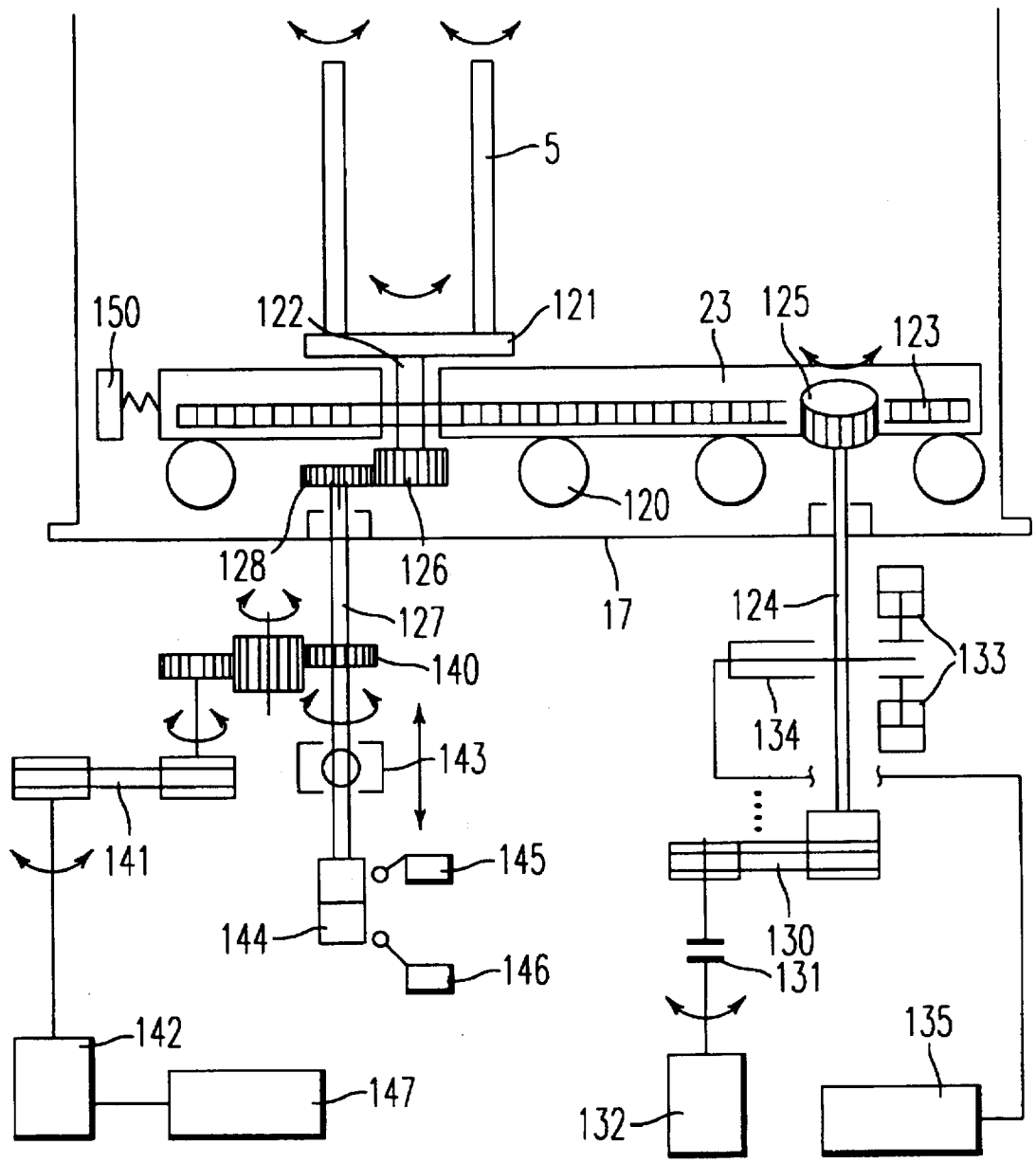
FIG. 18 is a driving system diagram for a work table and a rotary table.

Therefore, a modification of a horizontal movement means of the work table 23 will be explained referring to FIG. 18. In FIG. 18, an example of a means which rotates the works 5 on the work table 23 is shown together with the movement means of the work table 23. About the former, explanation will be given later.

Free rollers 120 are provided on the lower lid 17, and the work table is arranged to roll over them. A rack 123 is stuck on the side surface of the work table 23, and a pinion 125 which is to be in gear with the rack 123 is engaged into the shaft 124 which is protrusively provided on the lower lid 17. The shaft 124 is provided for making the work table 23 move in the horizontal direction. The shaft 124 is connected to a driving motor 132 through a pair of pulleys 130 and a clutch 131. A disk brake 133 is provided on the shaft 124, and an encoder switch 134 is provided to detect the rotating position of the disk. The driving motor 132 is controlled by the driver 135, and the rotating information of the encoder switch 134 is input to the driver 135. The work table 23 is taken into the vacuum chamber by the pinion 125. In the last step, a bias voltage transmission portion 150 to apply a bias voltage to the works 5 on the work table 23 is conveyed to a position where it is closely attached to the works 5 with a predetermined pressing force. In that position, when the shaft 124 is fixed by the disk brake 133 in the state where the pinion 125 is in gear with the rack 123, the work table is fixed at a predetermined position, and the bias voltage is securely transmitted to the works.

When the work table 23 is taken in, in some case, the rack 123 and the pinion 125 collide with each other and not engaged with each other. Therefore, when the work table is taken out, the angle of rotation at the position where the pinion 125 is separated from the rack 123 is stored in the driver 135 through an encoder switch 134. When it is taken in, the clutch 131 is made ON and the driving motor 132 is operated to make the angle of rotation be equal to the stored value and the clutch is made OFF. Then, the rack 123 on the work table 23, which is pushed in by other driving means, can be engaged smoothly with the pinion 125.

Next, a means which rotates the works 5 on the work table 23 will be explained. On the work table 23, a rotary table 121 is supported freely rotatably with a shaft, and a rotating shaft 122 is protrusively provided extending up to be close to the bottom of the work table 23. A gear 126 is engaged with the rotating shaft 122, and a gear 128 to be in gear with the gear 126 is engaged with a shaft 127 which is protrusively provided. The shaft 127 is provided to rotate the rotary table 121, and it is connected to a driving motor 142 through a gear train 140 and a pulley 141. A ball joint 143 is provided on the lower end of the shaft 127, and after it is through with the rotation, it is connected to an air cylinder 144. The air cylinder 144 comprises limit switches, 145 and 146, for the upper and lower limits, and a vertical reciprocation is possible. When a work table is taken in or taken out, the air cylinder 144 is contracted, and the gear 128 retreats to a position being lower than the gear 126. When the work table 23 is fixed at a predetermined position, the air cylinder 144 is elongated, but whether the gear 128 and the gear 126 come into gear with each other or not is not certain. When the contraction and the elongation of the air cylinder 144 are repeated several times in inching the driving motor 142 by the driver 147, the gear 128 and the gear 126 come into gear with each other.

When the horizontal movement means and the rotating means for works 5 are constituted as described in the above, only 2 shafts, 124 and 127, are provided protrusively on the lower lid 17, so that vacuum seal is needed only in these parts, which makes it possible to perform vacuum seal securely. Because of the use of the rack 123 and the pinion 125, the drive for the work table 23 can be performed securely, and also a work table can be fixed by fixing the shaft 124 into which the pinion 125 is engaged. The horizontal movement means of a work table 23 and the rotating means of the works 5 can be applied to a conventional AIP device with a flat evaporation source.

Next, the AIP system to perform an automatic exchange of the above-mentioned work tables 23 will be explained referring to FIG. 3. The traveling flat car 30 comprises roller rails, 31 and 32, and a first loading portion A and a second loading portion B for placing work tables 23 are provided on it. The work table 23 are placed on a rail 33 being so arranged that they can reciprocate by the distance P' which is equal to the distance P between the first loading portion A and the second loading portion B. In the case of an automatic exchange of work tables 23, the traveling flat car 30 is in a position written with a full line and it waits in a state where the first loading portion A is vacant. Then, a work table 23 loaded with processed works 5 is taken out in the direction (1) and the flat traveling car 30 travels by the distance P' in the direction (2) and it is positioned in a place shown with a 2-dot chain line, and the second loading portion B faces the vacuum chamber 1. Then, a work table 23 loaded with unprocessed works 5 loaded on the second loading portion B is taken into the vacuum chamber 1 in the direction (3). The work table 23 is taken into the vacuum chamber 1 in the order of FIG. 2(b)–FIG. 2(a)–FIG. 1. When a worker works till he places the work table 23 loaded with unprocessed works on the second loading portion B, the exchange of work tables is automatically performed, and a work table 23 loaded with processed works 5 is placed on the first loading portion A, and the second loading portion B is left in a vacant state. Only the work which has to done by a worker in a cycle time is to change the works 5 and the shielding plate 24 on the work table 23 on the first loading portion A. The above-mentioned rod-shaped anode 103 can be loaded on the work table 23, and in that case, it is desirable that the rod-shaped anode may have a constitution in which the exchange of the anodes is easy.

Figure 19:
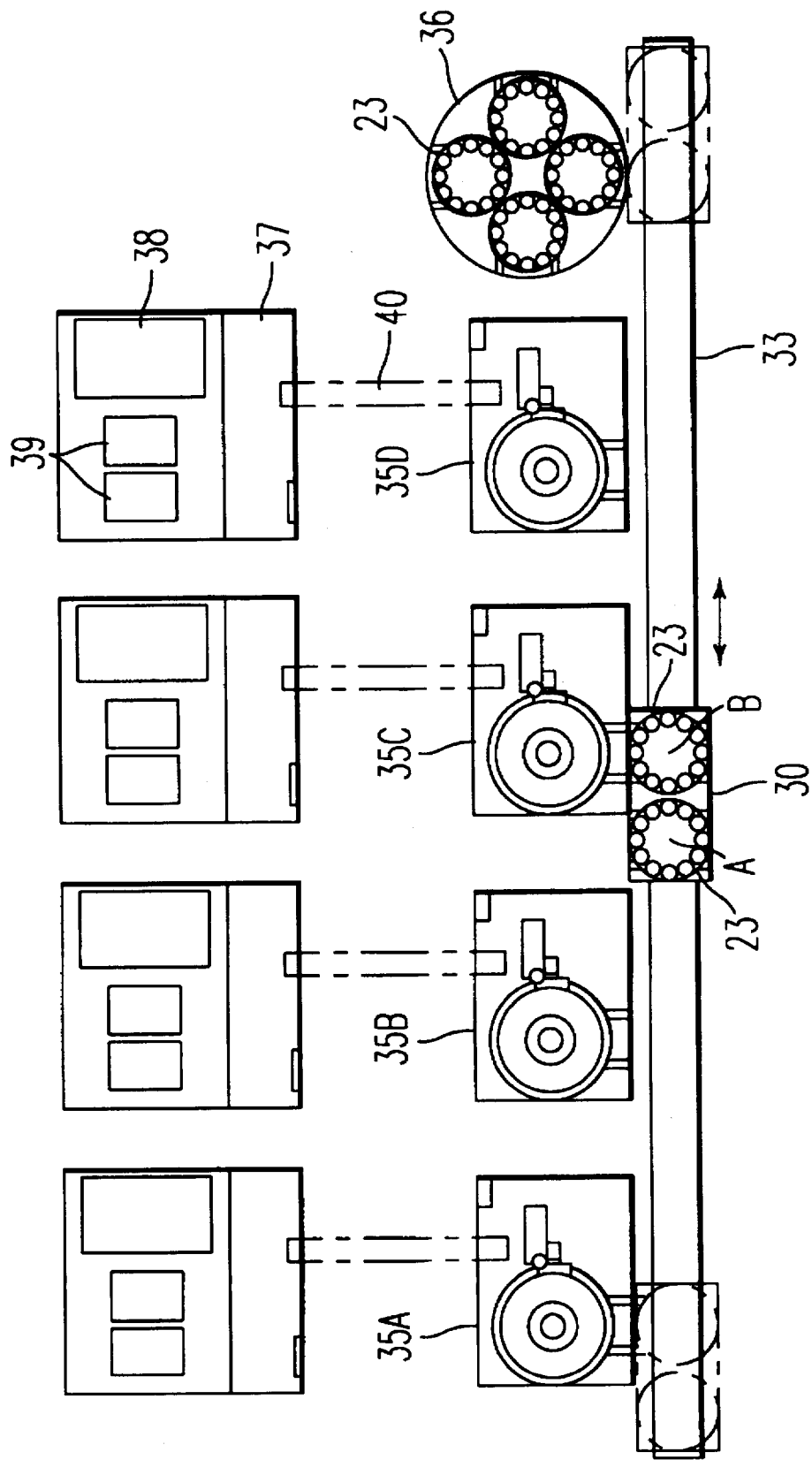
FIG. 19 is a top view of another AIP system using a traveling flat car.

FIG. 19 shows an AIP system in which a unit of flat car 30 is used for a plurality of AIP devices (4 devices in the figure). Four units of AIP devices, 35A, 35B, 35C and 35D are placed in order along the rail 33, and a turn table 36 is provided at an end of the rail 33. A reference numeral 37 is a switch board / control board, 38 is a bias power supply unit, 39 is an arc power supply unit, and 40 is a rack wiring. A worker places 4 work tables 23 loaded with unprocessed works 5 and clean shielding plates 24 on the turntable 36. When the process of works on a specific AIP device becomes close to an end, the second loading portion B on the traveling flat car receives a work table 23 loaded with unprocessed works 5 from the turntable 36 and an automatic exchange of work tables is performed as shown in FIG. 3, and a work table loaded with processed works 5 is returned to the turntable 36. As described in the above, when the cycles of respective AIP devices are finished, there remains a state where work tables loaded with processed works 5 are on the turn table. Then, a worker will exchange works 5 and shielding plates 24 and, if necessary, rod-shaped anodes in a lot. In the example shown in FIG. 3 and FIG. 19, 2 work table loading portions are provided; however, a system as shown below is also good: there is only one loading portion, and at first, it receives a work table loaded with processed works, and after it is conveyed to a turntable 36, it receives a work table loaded with unprocessed works and conveys it to the AIP device.

Figure 20:
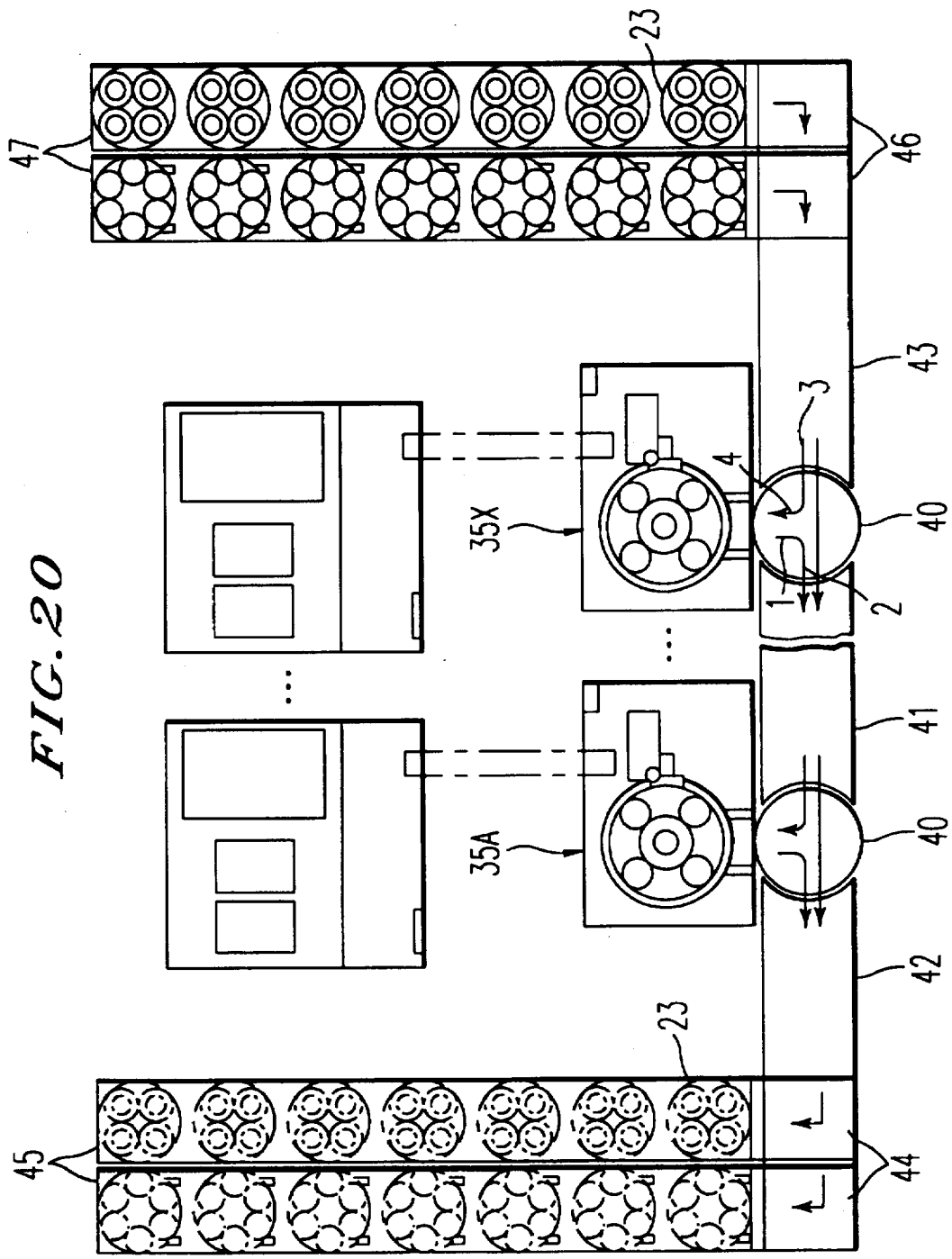
FIG. 20 is a top view of an AIP system using a rotary table.

FIG. 20 shows an AIP system in which a rotary table 40 is used in place of a traveling flat car. In front of respective AIP devices, 35A, - - - 35X, rotary tables, 40, - - - 40, are provided, and respective rotary tables, 40, - - - 40, are connected with both-way conveyers, 41, - - - 41. A take-out conveyer 42 is connected to the opposite side of a both-way conveyer 41 of a rotary table 40 in front of the AIP device 35A, and a first stocker 45, which is able to store a plurality of work tables loaded with processed works 5, is connected to an end of the take-out conveyer 42 through a cross table 44. Further, a take-in conveyer 43 is connected to the opposite side of a both-way conveyer 41 of a rotary table 40 in front of the AIP device 35X, and a second stocker 47, which is able to store a plurality of work tables loaded with unprocessed works 5, is connected to an end of the take-in conveyer 43 through a cross table 46. For example, when an automatic exchange in an AIP 35X is needed, a work table 23 loaded with processed works 5 is taken out as indicated by an arrow mark (1) on a rotary table 40, and the rotary table 40 is turned and the work table 23 loaded with processed works 5 is sent out to a both way conveyer 41 in the direction shown with an arrow mark (2). The work table 23 loaded with processed works 5 passes through the rotary table 40 of the AIP device 35A and is stored in the first stocker 45 through the cross table 44. On the other hand, a work table 23 loaded with unprocessed works 5 is taken out from the second stocker 47 through a cross table 46 and taken into a turn table 40 in the direction (3), and the turn table 40 is turned and the work table 23 loaded with unprocessed works 5 is sent out in the direction (4). As described in the above, automatic exchanges of work tables, 35A, - - - 35X, of AIP devices are performed in order.

According to the AIP system shown in FIG. 3, FIG. 19 and FIG. 20, a work table 23 loaded with unprocessed works 5 or with processed works 5 can be conveyed automatically, so that an AIP device can be operated in the nighttime without an attendance of a worker, which makes it possible to realize high productivity.

The automatic exchange system shown in FIG. 3, FIG. 19 and FIG. 20 can be applied not only to the AIP device in which a rod-shaped evaporation source 14 is adopted, but also to an AIP device which has a flat-shaped anode as shown in FIG. 23. Such an example is shown in FIGS. 21(a)–21(b) is a top view and FIG. 21(b) is a side view. Flat-shaped evaporation sources 51 are provided on both sides in a vacuum chamber 50, and there is a valve plate 52 fixed on a gate valve 53 which can be moved up and down, in front of the vacuum chamber 50. A work table 23 loaded with works 5 is taken out on a traveling flat car 30 (or a rotary table 40) in a state where the valve plate 52, an open/close door, is lifted.

Figure 22:
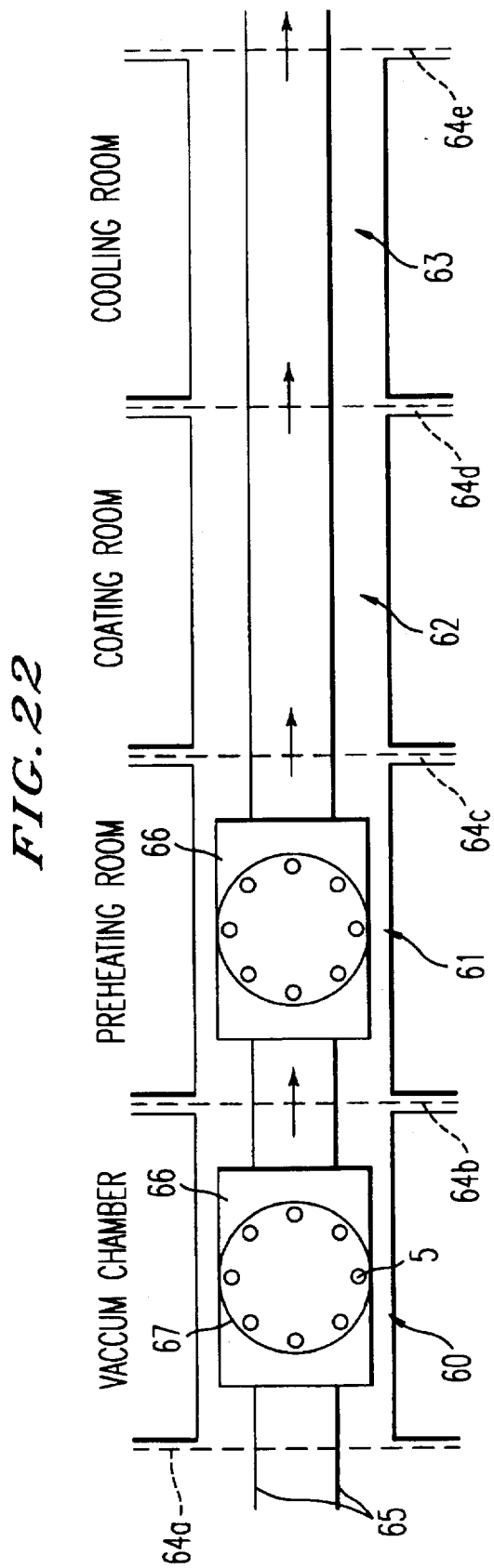
FIG. 22 is a concept drawing showing the application of a shielding plate to an AIP device of an in-line system.

The loading of a shielding plate on a work table besides works 5 can be applied not only to an AIP device of a batch system as explained in the above, but also to an in-line system AIP device as shown in FIG. 22. In the in-line system AIP device, a vacuum chamber 60, a preheating room 61, a coating room 62 and a cooling room 63 are connected to each other through gate valves, 64a, 64b, 64c and 64d, and a work table 66 is conveyed in respective rooms, 60 to 63, in order on a rail 65. Works 5 and a shielding plate 67 are loaded on the work table 66, a work table 66 loaded with a clean shielding plate 67 is taken into the vacuum chamber 60, and a work table 66 loaded with a dirty shielding plate 67 is taken out from the cooling room. Therefore, the exchange of shielding plates in every line (every travel) can be performed in the outside of the system without stopping the AIP device, so that always the coating with a clean shielding plate 67 can be performed. Further in an AIP device, if the AIP device is so constituted that an anode is also conveyed together with the works 5 and the shielding plate 67 being loaded on a work table 66, the exchange or cleaning of anodes can be easily and effectively performed.

Probability of Utilization on Industry

In an AIP device according to the present invention and an AIP system provided with the device, the take-in or take-out of works into or from the device can be easily performed, so that they have high productivity and they can be applied to various kinds of surface processing work, especially, they are effective in the process of bar-shaped works.

What is claimed is:

1. An arc ion plating device comprising: a rod-shaped evaporation source for generating an arc; works to be coated with a film, said works being disposed so as to surround said rod-shaped evaporation source; and means for moving said works relative to said rod-shaped evaporation source in a direction which is parallel to a vertical longitudinal axis of said rod-shaped evaporation source between a first position where said works are located radially around said rod-shaped evaporation source so as to permit substantially horizontal radial ions evaporated from said rod-shaped evaporation source to irradiate said works, and a second position in which said works are located below a bottom end of said rod-shaped evaporation source.

2. An arc ion plating device comprising: a vacuum chamber; a rod-shaped evaporation source provided in said vacuum chamber; and works to be coated with a film, said works being disposed so as to surround said rod-shaped evaporation source, said vacuum chamber being composed of a lower lid loaded with said works, and a main body to which an upper end of said rod-shaped evaporation source is fixed, said lower lid being capable of moving relative to said main body in a vertical direction;

wherein said works are loaded on a work table disposed on said lower lid and a shielding plate is also loaded on said work table together with said works.

3. The arc ion plating device described in claim 2, wherein said lower lid is able to ascend to or descend from said main body.

4. The arc ion plating device described in claim 3, wherein after said lower lid is made to descend, upper ends of said works are positioned lower than a lower end of said rod-shaped evaporation source, said works being capable of moving horizontally with respect to said lower lid.

5. The arc ion plating device described in claim 4, wherein said works are loaded on a work table disposed on said lower lid, said work table is made to be capable of moving horizontally with respect to said lower lid by a rack provided on said work table and a pinion provided on said lower lid.

6. The arc ion plating device described in claim 2, wherein an anode is also loaded on said work table.

7. An arc ion plating device comprising: a vacuum chamber; a rod-shaped evaporation source provided in said vacuum chamber; and works to be coated with a film, said works being disposed so as to surround said evaporation source, said vacuum-chamber being composed of a main body to which a first end of said rod-shaped evaporation source is fixed, and a lid body which holds said works and which is made to be capable of moving relative to said main body in an axial direction of said rod-shaped evaporation source and to which a second end of said rod-shaped evaporation source is connected through an electrical connecting means, said electrical connecting means being freely attachable or detachable to or from said rod-shaped evaporation source by movement of said lid body, said rod-shaped evaporation source being supplied by an arc power source from the first and second ends of the rod-shaped evaporation source.

8. The arc ion plating device described in claim 7, wherein said electrical connecting means is so constituted that a plane member supported by said lid body through an elastic means can be abutted against the second end of said rod-shaped evaporation source.

9. An arc ion plating device comprising:
a rod-shaped evaporation source for generating an arc;
works to be coated with a film, said works being disposed so as to surround said rod-shaped evaporation source, said works being capable of moving relative to said rod-shaped evaporation source in an axial direction of said rod-shaped evaporation source, wherein a target member, a hollow cylinder having a center hole, of said rod-shaped evaporation source is supported by a shaft inserted into said center hole.

10. The arc ion plating device described in claim 9, wherein an outer path is provided between said target member and said shaft, a central path is provided in a center of said shaft, a lateral path which communicates said central path and said outer path is provided, and said rod-shaped evaporation source is cooled by a cooling medium passing through said lateral path, said outer path, and said central path.

11. The arc ion plating device described in claim 10, wherein said shaft has a nut for supporting said target member, and said nut supports said target member through an elastic body.

12. An arc ion plating device comprising: a vacuum chamber; a rod-shaped evaporation source having first and second ends and being provided in said vacuum chamber; an anode to generate an arc between said rod-shaped evaporation source; works to be coated with a film, said works being disposed so as to surround said rod-shaped evaporation source, said anode being ring-shaped anodes symmetrically provided on the first and second ends of said rod-shaped evaporation source so as to be coaxial with said rod-shaped evaporation source.

13. An arc ion plating device comprising: a vacuum chamber; a rod-shaped evaporation source having first and second ends and being provided in said vacuum chamber; an anode to generate an arc between said rod-shaped evaporation source; and works to be coated with a film, said works being disposed so as to surround said rod-shaped evaporation source, said anode comprising a rod-shaped anode composed of continuous linear rods disposed on a concentric circle around said rod-shaped evaporation source, said continuous linear rods of said anode having first and second ends and being positioned between said rod-shaped evaporation source and the works, said continuous linear rods of said anode further being supplied with arc electric power from said first and second ends of said continuous linear rods of said anode.

14. The arc ion plating device as described in claim 12 or claim 13, wherein arc electric power is supplied from the first and second ends of said rod-shaped evaporation source.

15. The arc ion plating device as described in claim 13, wherein said anode can be utilized as a heater for preheating said works before the coating operation of the works with a film is started.

16. An arc ion plating system comprising: a traveling flat car being able to travel along more than a unit of arc ion plating devices which take in or take out work tables loaded with works and having shielding plates; and first and second loading portions for loading said work tables being provided on said flat car which is moved to a position facing said arc ion plating devices with a travel of the traveling flat car; wherein said work tables are capable of being taken out or taken in automatically between said first and second loading portions and said arc ion plating devices.

17. The arc ion plating system described in claim 16, wherein said traveling flat car is provided to be able to travel on a rail provided along said arc ion plating devices, and a turn table on which a plurality of work tables can be loaded is provided along the rail, and an automatic exchange of work tables can be performed between said turntable and said traveling flat car.

18. An arc ion plating system comprising: a plurality of rotary tables being provided in front of respective arc ion plating devices and being able to take in or take out work tables loaded with works and having shielding plates to or from said arc ion plating devices and to change a direction of said work tables; a two-way conveyer connecting said plurality of rotary tables to each other and conveying said work tables; a first stocker being able to store a plurality of work tables loaded with processed works and being connected to a first rotary table positioned at an end of a takeout conveyer located at a first side of said two-way conveyer; and a second stocker being able to store a plurality of work tables loaded with unprocessed works and being connected to a second rotary table positioned at an end of a take-in conveyer located at a second side of said two-way conveyer which is opposite said first side.

19. The arc ion plating device described in claim 9, further comprising:
means for moving said works relative to said rod-shaped evaporation source in a direction which is parallel to the axial direction of said rod-shaped evaporation source between a first position where said works are located radially around said rod-shaped evaporation source so as to permit substantially horizontal radial ions evaporated from said rod-shaped evaporation source to irradiate said works, and a second position in which said works are located below a bottom end of said rod-shaped evaporation source.

20. The arc ion plating device described in claim 12, further comprising:

means for moving said works relative to said rod-shaped evaporation source in a direction which is parallel to a vertical longitudinal axis of said rod-shaped evaporation source between a first position where said works are located radially around said rod-shaped evaporation source so as to permit substantially horizontal radial ions evaporated from said rod-shaped evaporation source to irradiate said works and a second position in which said works are located below a bottom end of said rod-shaped evaporation source.

21. The arc ion plating device as described in claim 12, wherein said ring-shaped anodes each have a conical surface which faces said rod-shaped evaporation source.

22. The arc ion plating device as described in claim 13, wherein said anode further comprises ring shaped anodes provided on the first and second ends of the rod shaped evaporation source.

* * * * *